(12) United States Patent
Choi et al.

(10) Patent No.: US 12,302,713 B2
(45) Date of Patent: May 13, 2025

(54) DISPLAY PANEL AND ELECTRONIC APPARATUS INCLUDING THE SAME

(71) Applicant: SAMSUNG DISPLAY CO., LTD., Yongin-si (KR)

(72) Inventors: Nakcho Choi, Yongin-si (KR); Sungmin Kim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 575 days.

(21) Appl. No.: 17/339,218

(22) Filed: Jun. 4, 2021

(65) Prior Publication Data
US 2022/0149135 A1 May 12, 2022

(30) Foreign Application Priority Data
Nov. 11, 2020 (KR) .......................... 10-2020-0150511

(51) Int. Cl.
| | |
|---|---|
| *H10K 59/126* | (2023.01) |
| *H10K 59/122* | (2023.01) |
| *H10K 59/38* | (2023.01) |
| *H10K 59/80* | (2023.01) |
| *H10K 59/40* | (2023.01) |
| *H10K 59/65* | (2023.01) |

(52) U.S. Cl.
CPC ......... *H10K 59/126* (2023.02); *H10K 59/122* (2023.02); *H10K 59/38* (2023.02); *H10K 59/8791* (2023.02); *H10K 59/8792* (2023.02); *H10K 59/40* (2023.02); *H10K 59/65* (2023.02)

(58) Field of Classification Search
CPC ...... H10K 59/8791–8792; H10K 59/12–1315; H10K 59/40; H10K 59/65; H10K 50/865; H01L 51/5281; H01L 51/5284; H01L 27/3244–3279; H01L 27/323; H01L 27/3234
See application file for complete search history.

(56) References Cited

U.S. PATENT DOCUMENTS

| | | |
|---|---|---|
| 8,842,242 B2 | 9/2014 | Park et al. |
| 10,455,711 B2 | 10/2019 | Seo et al. |
| 10,896,939 B2 | 1/2021 | Jeon et al. |

(Continued)

FOREIGN PATENT DOCUMENTS

| | | |
|---|---|---|
| CN | 110867476 A | 3/2020 |
| KR | 101494454 B1 | 2/2015 |

(Continued)

*Primary Examiner* — Lauren R Bell
(74) *Attorney, Agent, or Firm* — CANTOR COLBURN LLP

(57) ABSTRACT

A display panel includes a first display area in which first light-emitting diodes are arranged, a second display area at least partially surrounded by the first display area and in which display element groups including second light-emitting diodes and a transmission area are arranged, a light-shielding insulating layer defining a light-emitting area of each of the first light-emitting diodes and the second light-emitting diodes, and an anti-reflection layer on the light-shielding insulating layer and including a light-shielding layer and color filters, where, in a plan view, an outermost line of the transmission area is defined by a curved edge of at least one of the light-shielding layer and the light-shielding insulating layer.

23 Claims, 26 Drawing Sheets

(56) References Cited

U.S. PATENT DOCUMENTS

| | | | | |
|---|---|---|---|---|
| 2017/0141180 | A1* | 5/2017 | Matsumoto | H10K 50/824 |
| 2018/0047790 | A1* | 2/2018 | Chae | H10K 59/12 |
| 2020/0064968 | A1 | 2/2020 | Kim et al. | |
| 2020/0120815 | A1 | 4/2020 | Jin | |
| 2020/0176520 | A1 | 6/2020 | Kim et al. | |
| 2020/0357871 | A1* | 11/2020 | Chung | H10K 50/865 |
| 2021/0126077 | A1 | 4/2021 | Chae et al. | |
| 2021/0134932 | A1 | 5/2021 | Chae et al. | |
| 2021/0135165 | A1 | 5/2021 | Kim | |
| 2021/0143231 | A1 | 5/2021 | Chae et al. | |
| 2021/0159286 | A1 | 5/2021 | Ma et al. | |
| 2021/0351236 | A1* | 11/2021 | Shin | H04M 1/0268 |
| 2023/0006183 | A1* | 1/2023 | Rhe | G06F 3/0446 |

FOREIGN PATENT DOCUMENTS

| | | | | |
|---|---|---|---|---|
| KR | 1020180077388 A | | 7/2018 | |
| KR | 1020190096472 A | | 8/2019 | |
| KR | 2020039866 A | * | 4/2020 | H01L 27/322 |
| KR | 1020200041415 A | | 4/2020 | |
| KR | 1020210050058 A | | 5/2021 | |
| KR | 1020210052724 A | | 5/2021 | |
| KR | 1020210052757 A | | 5/2021 | |
| KR | 1020210059091 A | | 5/2021 | |
| WO | WO-2021228219 A1 | * | 11/2021 | H01L 27/322 |

* cited by examiner

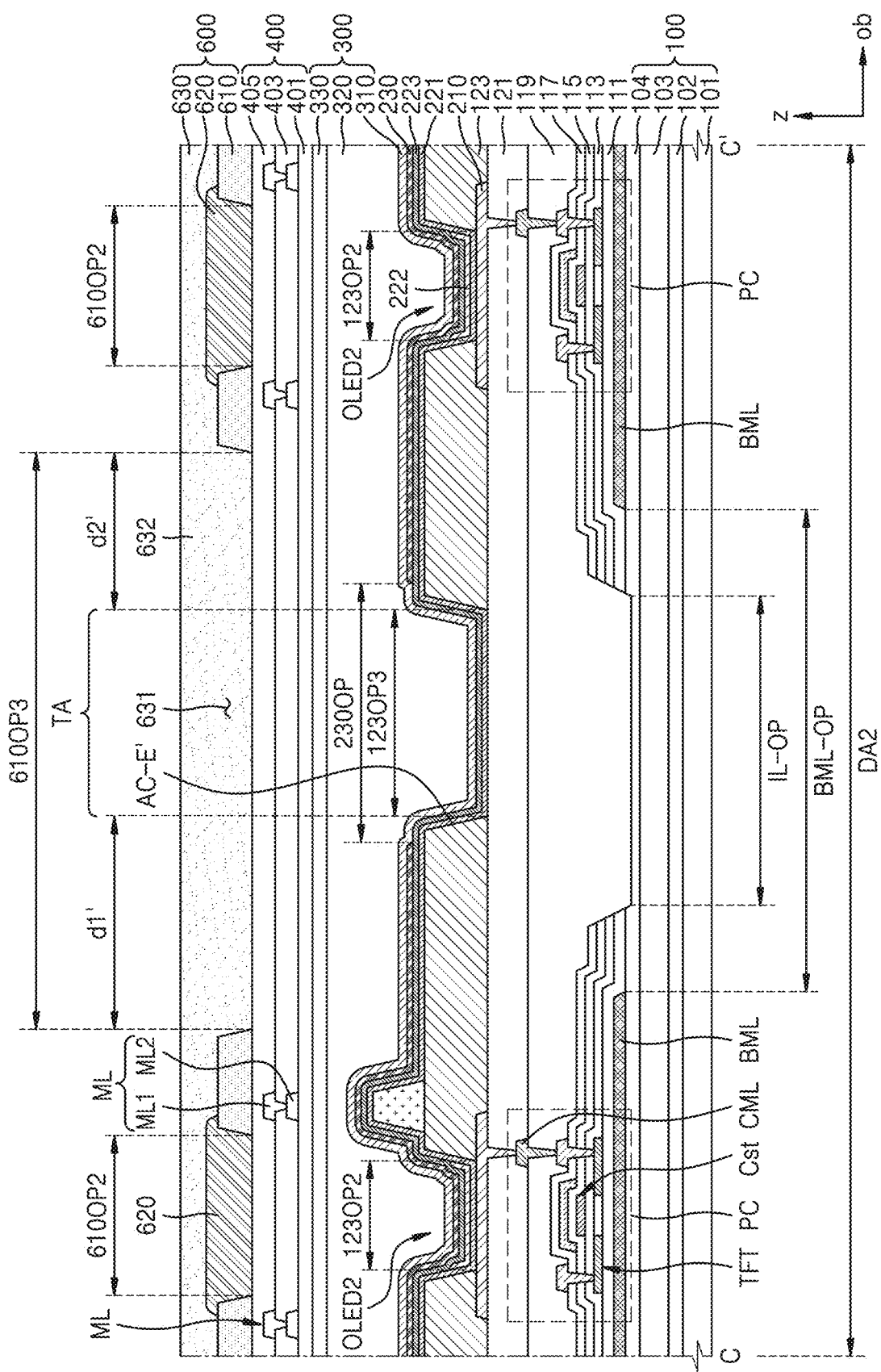

DISPLAY PANEL AND ELECTRONIC APPARATUS INCLUDING THE SAME

This application claims priority to Korean Patent Application No. 10-2020-0150511, filed on Nov. 11, 2020, and all the benefits accruing therefrom under 35 U.S.C. § 119, the content of which in its entirety is herein incorporated by reference.

BACKGROUND

1. Field

One or more embodiments relate to a display panel and an electronic apparatus including the display panel.

2. Description of Related Art

As display devices are becoming thinner and lighter, usage thereof is being steadily diversified and expanded.

As an area occupied by a display area in a display device is being expanded, various functions combined with or linked to display devices are being added. As a way to add various functions to a display device while expanding a display area, there is ongoing research on display devices that have an area inside the display area, in which various functions other than displaying an image are added.

SUMMARY

In order to add various functions, a component such as a camera or a sensor may be arranged. A component may be arranged to overlap a display area to secure a larger display area. As a method of arranging components, a display panel may include a transmission area through which light or sound may pass. Embodiments of the invention include a display panel having the above structure and an electronic apparatus including the display panel.

Additional features of the invention will be set forth in part in the description that follows and, in part, will be apparent from the description, or may be learned by practice of the embodiments of the invention.

In an embodiment of the invention, a display panel includes a first display area in which first light-emitting diodes are arranged, a second display area at least partially surrounded by the first display area and in which display element groups including second light-emitting diodes and a transmission area are arranged, a light-shielding insulating layer defining a light-emitting area of each of the first light-emitting diodes and the second light-emitting diodes, and an anti-reflection layer on the light-shielding insulating layer and including a light-shielding layer and color filters, where, in a plan view, an outermost line of the transmission area is defined by a curved edge of at least one of the light-shielding layer and the light-shielding insulating layer.

In an embodiment, first openings respectively corresponding to the first light-emitting diodes, second openings respectively corresponding to the second light-emitting diodes, and a third opening between the display element groups may be defined in the light-shielding insulating layer.

In an embodiment, fourth openings respectively overlapping the first openings, fifth openings respectively overlapping the second openings, and a sixth opening overlapping a portion of the third opening may be defined in the light-shielding layer.

In an embodiment, the color filters may be disposed at the fourth openings and the fifth openings, and the anti-reflection layer may further include an overcoat layer in which a portion thereof is disposed at the sixth opening.

In an embodiment, each of the first light-emitting diodes and the second light-emitting diodes may include an overlapping structure, where the overlapping includes a first electrode, an emission layer on the first electrode, and a second electrode provided as a single body to correspond to the first light-emitting diodes and the second light-emitting diodes, where an opening overlapping the third opening and the sixth opening may be defined in the second electrode.

In an embodiment, the display panel may further include thin-film transistors electrically connected to each of the first light-emitting diodes and the second light-emitting diodes, where each of the thin-film transistors may include a semiconductor layer, In an embodiment, a gate electrode overlapping a portion of the semiconductor layer, one electrode from among a source electrode and a drain electrode, and an insulating layer disposed between at least two selected from among the semiconductor layer, the gate electrode, and the one electrode.

In an embodiment, an opening overlapping the third opening of the light-shielding insulating layer may be defined in the insulating layer.

In an embodiment, the display panel may further include an organic insulating layer on the insulating layer, where a portion of the organic insulating layer is disposed in the opening of the insulating layer.

In an embodiment, a width of the sixth opening of the light-shielding layer measured in a first direction crossing the curved edge may be less than a width of the third opening of the light-shielding insulating layer measured in the first direction.

In an embodiment, the light-shielding layer may include the curved edge defining an outermost line of the transmission area in the plan view, and, in the plan view, a portion of the light-shielding layer disposed at one side of the curved edge may cover a portion of the third opening.

In an embodiment, the light-shielding insulating layer may include a straight edge in the plan view, and the straight edge of the light-shielding insulating layer may be disposed closer to the first display area than the curved edge of the light-shielding layer is to the first display area.

In an embodiment, the light-shielding insulating layer may include a curved edge in the plan view, and the curved edge of the light-shielding insulating layer may be disposed closer to the first display area than the curved edge of the light-shielding layer is to the first display area.

In an embodiment, a width of the sixth opening of the light-shielding layer measured in a first direction crossing the curved edge may be greater than a width of the third opening of the light-shielding insulating layer measured in the first direction.

In an embodiment, the light-shielding layer may include the curved edge defining an outermost line of the transmission area, and the sixth opening may overlap a portion of the light-shielding insulating layer disposed at one side of the curved edge in the plan view.

In an embodiment, the light-shielding layer may include a straight edge in the plan view, and the straight edge of the light-shielding layer may be disposed closer to the first display area than the curved edge of the light-shielding insulating layer is to the first display area.

In an embodiment, a dummy opening between the first display area and the transmission area may be defined in one from among the light-shielding layer and the light-shielding insulating layer.

In another embodiment of the invention, an electronic apparatus includes a display panel including a first display area in which first light-emitting diodes are arranged, and a second display area in which second light-emitting diodes and a transmission area are arranged, and a component on a lower surface of the display panel and overlapping the second display area, where the display panel includes a light-shielding insulating layer defining a light-emitting area of each of the first light-emitting diodes and the second light-emitting diodes, and an anti-reflection layer on the light-shielding insulating layer and including a light-shielding layer and color filters, and, in a plan view, an outermost line of the transmission area is defined by a curved edge of at least one of the light-shielding layer and the light-shielding insulating layer.

In an embodiment, in the plan view, a width of the component may be greater than a width of a shape that is defined by the outermost line of the transmission area, the shape including a circle or an ellipse.

In an embodiment, first openings respectively corresponding to the first light-emitting diodes, second openings respectively corresponding to the second light-emitting diodes, and a third opening corresponding to the transmission area may be defined in the light-shielding insulating layer, and fourth openings respectively overlapping the first openings, fifth openings respectively overlapping the second openings, and a sixth opening overlapping the third opening may be defined in the light-shielding layer.

In an embodiment, the color filters may be disposed at the fourth openings and the fifth openings, and the anti-reflection layer further may include an overcoat layer of which a portion is disposed at the sixth opening.

In an embodiment, each of the first light-emitting diodes and the second light-emitting diodes may include an overlapping structure, the overlapping structure includes a first electrode, an emission layer on the first electrode, and a second electrode provided as a single body to correspond to the first light-emitting diodes and the second light-emitting diodes, where an opening overlapping the third opening and the sixth opening may be defined in the second electrode.

In an embodiment, the electronic apparatus may further include thin-film transistors electrically connected to each of the first light-emitting diodes and the second light-emitting diodes, where each of the thin-film transistors may include a semiconductor layer, a gate electrode overlapping a portion of the semiconductor layer, one electrode from among a source electrode and a drain electrode, and an insulating layer disposed between at least two selected from among the semiconductor layer, the gate electrode, and the one electrode.

In an embodiment, an opening overlapping the third opening of the light-shielding insulating layer may be defined in the insulating layer, and an edge of the insulating layer defining the opening may be closer to the transmission area than an edge of the light-shielding insulating layer defining the third opening is to the transmission area.

In an embodiment, the electronic apparatus may further include an organic insulating layer on the insulating layer, where a portion of the organic insulating layer may be disposed in the opening of the insulating layer.

In an embodiment, a width of the sixth opening of the light-shielding layer measured in a first direction crossing the curved edge may be less than a width of the third opening of the light-shielding insulating layer measured in the first direction.

In an embodiment, a width of the sixth opening of the light-shielding layer measured in a first direction crossing the curved edge may be greater than a width of the third opening of the light-shielding insulating layer measured in the first direction.

In an embodiment, the light-shielding insulating layer may include the curved edge defining the outermost line of the transmission area in the plan view, the light-shielding layer may include a straight edge in the plan view, and the straight edge of the light-shielding layer may be disposed closer to the first display area than the curved edge of the light-shielding insulating layer is to the first display area.

In an embodiment, the light-shielding insulating layer may include the curved edge defining the outermost line of the transmission area in the plan view, the light-shielding layer may include a straight edge in the plan view, and the straight edge of the light-shielding layer may be disposed closer to the first display area than the curved edge of the light-shielding insulating layer is to the first display area.

In an embodiment, the light-shielding layer may include a first curved edge in the plan view, the light-shielding insulating layer may include a second curved edge in the plan view, and the curved edge defining the outermost line of the transmission area may correspond to the first curved edge or the second curved edge.

In an embodiment, a dummy opening between the first display area and the transmission area may be defined in one from among the light-shielding layer and the light-shielding insulating layer.

In an embodiment, the component may include a sensor or a camera.

These and/or other features will become apparent and more readily appreciated from the following detailed description of the embodiments, the accompanying drawings, and claims.

BRIEF DESCRIPTION OF THE DRAWINGS

The above and other embodiments, features, and advantages of embodiments of the invention will be more apparent from the following description taken in conjunction with the accompanying drawings, in which:

FIG. 2A is a perspective view illustrating an embodiment of a folded state of a foldable electronic apparatus;

FIG. 2B illustrates an embodiment of an unfolded state of a foldable electronic apparatus;

FIG. 15 is a cross-sectional view of an embodiment of the display panel in FIG. 14C, taken along line C-C';

DETAILED DESCRIPTION

Figure 1:
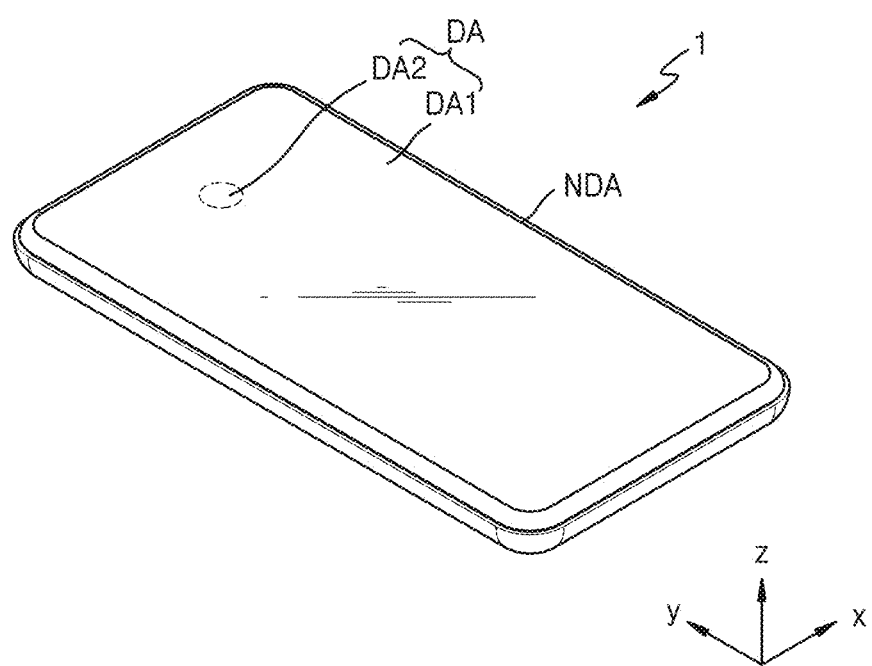
FIG. 1 is a perspective view illustrating an embodiment of an electronic apparatus.

Reference will now be made in detail to embodiments, examples of which are illustrated in the accompanying drawings, where like reference numerals refer to like elements throughout the disclosure. In this regard, the embodiments may have different forms and configuration and should not be construed as being limited to the descriptions set forth herein. Accordingly, the embodiments are merely described below, by referring to the drawing figures, to explain features of the disclosure. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or any variations thereof.

Because the disclosure may have diverse modified embodiments, embodiments are illustrated in the drawings and are described with respect to the embodiments. An effect and a characteristic of the disclosure, and a method of accomplishing them will be apparent by referring to embodiments described with reference to the drawings. The disclosure may, however, be embodied in many different forms and configurations and should not be construed as limited to the embodiments set forth herein.

Hereinafter, embodiments will be described with reference to the accompanying drawings, where like reference numerals refer to like elements throughout the disclosure and a repeated description thereof is omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, region, or element is referred to as being "disposed on" another layer, area, or element, it can be directly or indirectly disposed on the other layer, region, or element. That is, for example, one or more intervening layers, regions, or elements may be present therebetween.

In the disclosure, the term "and/or" includes any and all combinations of one or more of the associated listed items. For example, "A and/or B" may include "A," "B," or "A and B."

Sizes of elements in the drawings may be exaggerated or contracted for convenience of explanation. In other words, because sizes and thicknesses of components in the drawings are arbitrarily illustrated for convenience of explanation, the following embodiments are not limited thereto.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

FIG. 1 is a perspective view illustrating an embodiment of an electronic apparatus 1.

Referring to FIG. 1, the electronic apparatus 1 may be an apparatus for displaying a moving image or a still image and may be used as a display screen of various products such as televisions, notebook computers, monitors, billboards, and Internet of Things ("IoT") as well as portable electronic apparatuses such as mobile phones, smart phones, tablet personal computers ("PCs"), mobile communication terminals, electronic notebooks, electronic books, portable multimedia players ("PMPs"), navigation, and ultra mobile PCs ("UMPCs"). In addition, the electronic apparatus 1 may be used in wearable devices such as smartwatches, watch-phones, glasses-type displays, and head-mounted displays ("HMD"). In addition, the electronic apparatus 1 in an embodiment may be used as a center information display ("CID") disposed at a vehicle's instrument panel or a vehicle's center fascia or dashboard, a room mirror display replacing a vehicle's side-view mirror, or a display disposed at a rear side of a vehicle's front seat as an entertainment for a vehicle's rear seat. FIG. 1 illustrates that the electronic apparatus 1 is used as a smart phone, for convenience of explanation.

Referring to FIG. 1, the electronic apparatus 1 may include a display area DA and a non-display area NDA outside the display area DA. The electronic apparatus 1 may provide an image through an array of a plurality of pixels that are two-dimensionally arranged in the display area DA.

The non-display area NDA may be an area that does not provide an image, and may entirely surround the display area DA. A driver or the like for providing an electrical signal or power to display elements arranged in the display area DA may be arranged in the non-display area NDA. The non-display area NDA may include a pad, which is an area to which an electronic element, a printed circuit board, or the like may be electrically connected.

The display area DA may include a first display area DA1 and a second display area DA2. The second display area DA2 is an area in which components for adding various functions to the electronic apparatus 1 are arranged, and may correspond to a component area.

Figure 2A:
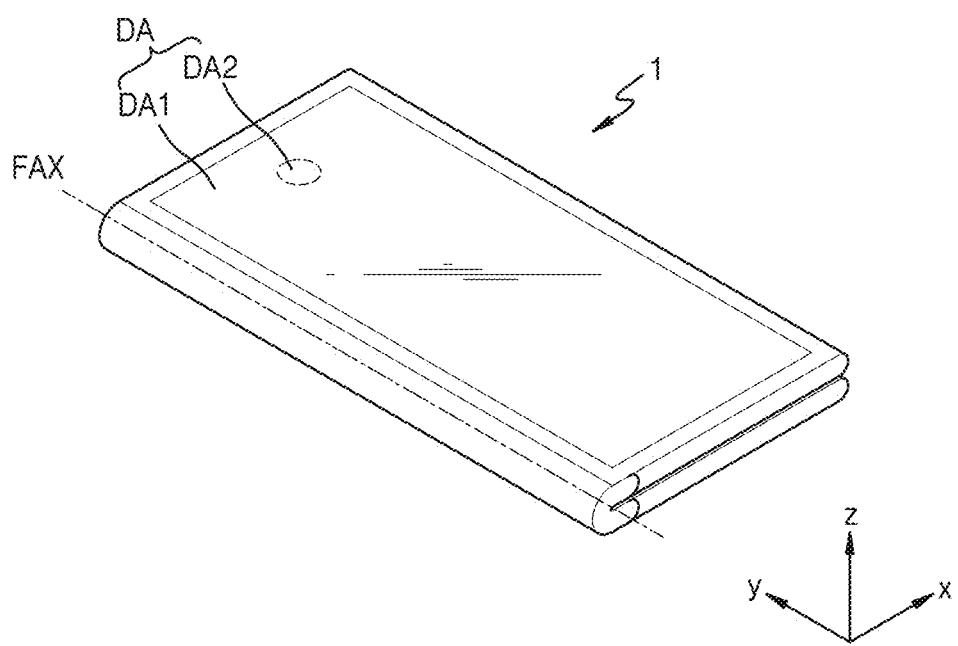
FIGS. 2A and 2B are perspective views of an embodiment of a foldable electronic apparatus.
Figure 2B:
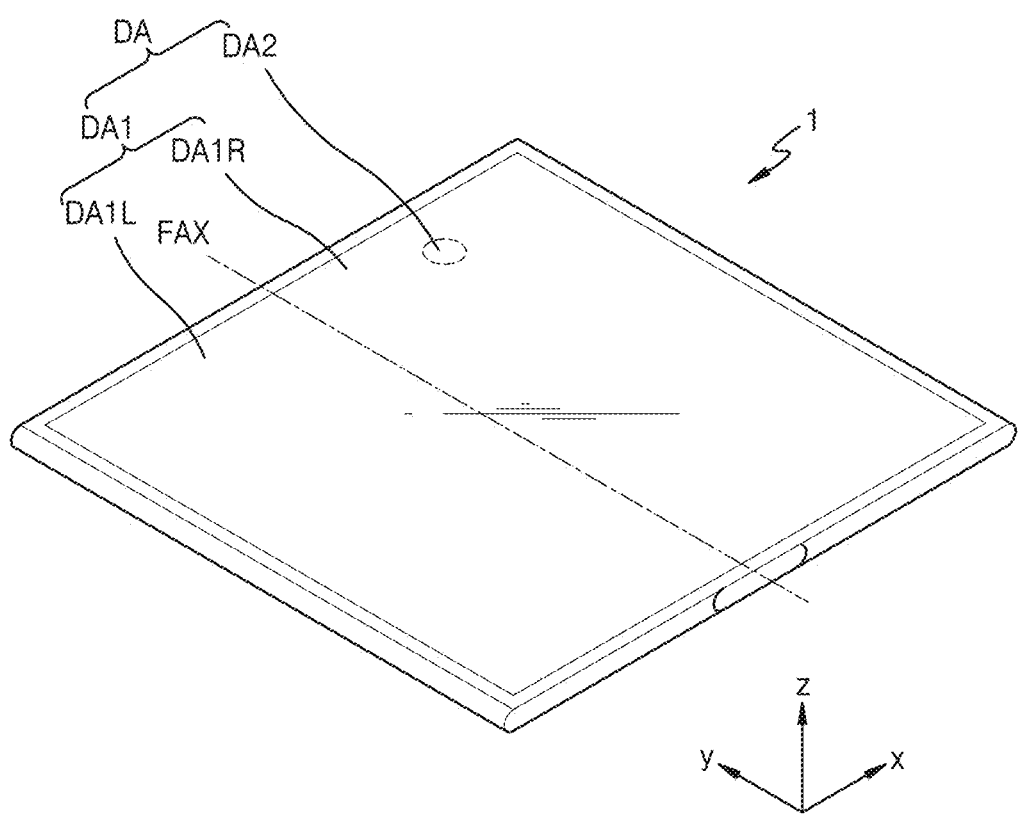

FIGS. 2A and 2B are perspective views of an embodiment of a foldable electronic apparatus, and FIG. 2A illustrates a folded state of the foldable electronic apparatus, and FIG. 2B illustrates an unfolded state of the foldable electronic apparatus.

The electronic apparatus 1 in an embodiment may be a foldable electronic apparatus. The electronic apparatus 1 may be folded around a folding axis FAX. The display area DA may be disposed outside and/or inside the electronic apparatus 1. In an embodiment, FIGS. 2A and 2B respectively illustrate that the display area DA is disposed on the outside and inside of the electronic apparatus 1.

Referring to FIG. 2A, the display area DA may be arranged on the outside of the electronic apparatus 1. An outer surface of the electronic apparatus 1 that is folded may include the display area DA, and the display area DA may include a first display area DA1 that occupies most of the display area DA, and a second display area DA2 having a relatively small area compared to the first display area DA1.

Referring to FIG. 2B, the display area DA may be arranged on the inside of the electronic apparatus 1. An inner surface of the electronic apparatus 1 that is unfolded may include the display area DA, and the display area DA may include a first display area DA1 that occupies most of the display area DA, and a second display area DA2 having a relatively small area compared to the first display area DA1.

FIG. 2B illustrates that the first display area DA1 includes a left display area DA1L and a right display area DA1R, which are arranged at opposite sides of the folding axis FAX, and that the second display area DA2 is disposed on the inside of the right display area DA1R. However, the invention is not limited thereto. In another embodiment, the second display area DA2 may be arranged inside the left display area DA1L.

Figure 3:
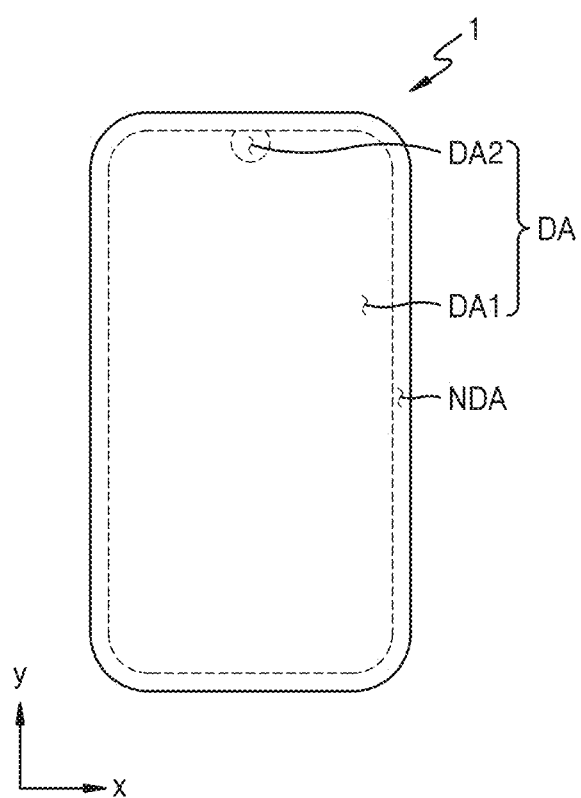
FIG. 3 is a plan view schematically illustrating an embodiment of an electronic apparatus.

FIGS. 1, 2A, and 2B illustrate that the second display area DA2 is entirely surrounded by the first display area DA1, but the invention is not limited thereto. FIG. 3 is a plan view schematically illustrating an electronic apparatus 1 in an embodiment, and as shown in FIG. 3, a second display area DA2 may be partially surrounded by a first display area DA1.

Figure 4:
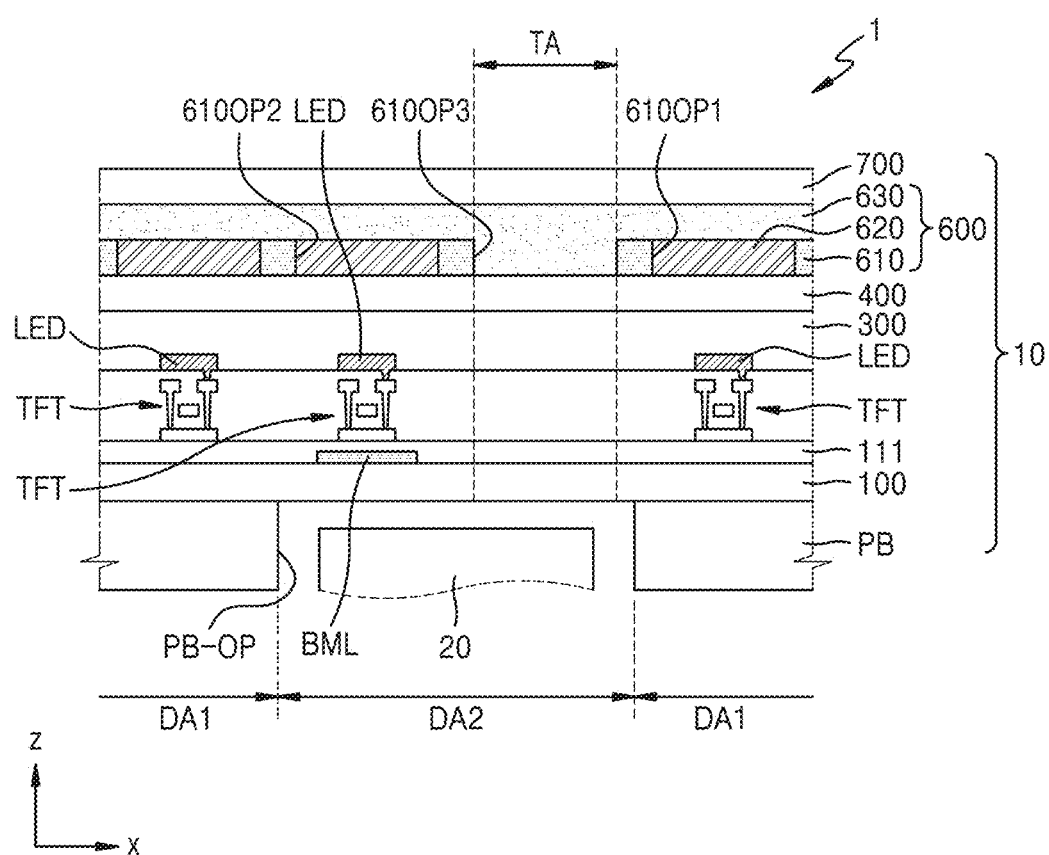
FIG. 4 is a cross-sectional view illustrating an embodiment of a part of an electronic apparatus.

FIG. 4 is a cross-sectional view illustrating an embodiment of a part of an electronic apparatus 1.

Referring to FIG. 4, the electronic apparatus 1 may include a display panel 10 and a component 20, where the component 20 is arranged on a lower surface of the display panel 10 overlapping the display panel 10. The component 20 may be disposed in the second display area DA2. The component 20 may overlap the second display area DA2.

The display panel 10 may include a substrate 100, a thin-film transistor TFT arranged on the substrate 100, a display element (e.g., a light-emitting diode LED) electrically connected to the thin-film transistor TFT, an encapsulation layer 300 covering the display element, an input sensing layer 400, an anti-reflection layer 600, and a window 700.

The substrate 100 may include glass or a polymer resin. The substrate 100 including the polymer resin may be flexible, foldable, or bendable. The substrate 100 may have a multi-layered structure including a layer including the aforementioned polymer resin and an inorganic layer (not shown).

A lower protective film PB may be arranged on a lower surface of the substrate 100. The lower protective film PB may be attached to the lower surface of the substrate 100. An adhesive layer may be disposed between the lower protective film PB and the substrate 100. In some embodiments, the lower protective film PB may be disposed directly on a rear surface of the substrate 100, and in this case, no adhesive layer is disposed between the lower protective film PB and the substrate 100.

The lower protective film PB may support and protect the substrate 100. An opening PB-OP corresponding to the second display area DA2 may be defined in the lower protective film PB. In an embodiment, the lower protective film PB may include an organic insulating material such as polyethylene terephthalate ("PET") or polyimide ("PI"), for example.

A thin-film transistor TFT and a light-emitting diode LED, which is a display element electrically connected to the thin-film transistor TFT, may be arranged on an upper surface of the substrate 100. The light-emitting diode LED may be an organic light-emitting diode including an organic material. In an embodiment, the organic-light emitting diode may emit red, green, and blue light, for example.

The light-emitting diode LED may be an inorganic light-emitting diode including an inorganic material. The inorganic light-emitting diode may include a PN junction diode including inorganic semiconductor-based materials. When a voltage is applied to the PN-junction diode in a forward direction, a hole and an electron are injected, and light of a color may be emitted by converting energy generated due to recombination of the hole with the electron to light energy. The aforementioned inorganic light-emitting diode may have a width of several to several hundred micrometers or several to several hundred nanometers. In an embodiment, the light-emitting diode LED may include a quantum-dot light-emitting diode. In an embodiment, an emission layer of the light-emitting diode LED may include an organic material, an inorganic material, quantum dots, an organic material and quantum dots, or an inorganic material and quantum dots, for example.

The light-emitting diode LED may be electrically connected to a thin-film transistor TFT arranged therebelow. In this regard, FIG. 4 illustrates that a buffer layer 111 is arranged on the substrate 100 and the thin-film transistor TFT is arranged on the buffer layer 111. The thin-film transistor TFT and the light-emitting diode LED electrically connected to the thin-film transistor TFT may be arranged in a first display area DA1 and the second display area DA2, respectively.

A transmission area TA may be disposed in the second display area DA2. The transmission area TA is an area through which light emitted from the component 20 and/or light directed to the component 20 may pass. In an embodiment, in a display panel, a transmittance of the transmission area TA may be about 30 percent (%) or more, about 40% or more, about 50% or more, about 60% or more, about 70% or more, about 75% or more, about 80% or more, about 85% or more, or about 90% or more, for example.

The component 20 may include a sensor such as a proximity sensor, an illuminance sensor, an iris sensor, and a facial recognition sensor, and a camera (or an image sensor). The component 20 may use light. In an embodiment, the component 20 may emit and/or receive light in infrared, ultraviolet, and visible bands. The proximity sensor using infrared rays may detect an object arranged close to an upper surface of electronic apparatus 1, and the illuminance sensor may detect a brightness of light incident onto the upper surface of electronic apparatus 1, for example. In addition, the iris sensor may photograph an iris of a person arranged on the upper surface of the electronic apparatus 1, and the camera may receive light from an object arranged on the upper surface of the electronic apparatus 1.

In order to prevent a function of the thin-film transistor TFT arranged in the second display area DA2 from deteriorating due to light passing the transmission area TA, a blocking metal layer BML may be arranged between the substrate 100 and the buffer layer 111. The blocking metal layer BML may not be disposed in the first display area DA1. The blocking metal layer BML may be disposed in the second display area DA2, and an opening overlapping the transmission area TA may be defined in the blocking metal layer BML.

The encapsulation layer 300 may cover light-emitting diodes LED. The encapsulation layer 300 may include at least one inorganic encapsulation layer and at least one organic encapsulation layer. In an embodiment, the encapsulation layer 300 may include first and second inorganic encapsulation layers and an organic encapsulation layer therebetween.

The input sensing layer 400 may be disposed on the encapsulation layer 300. The input sensing layer 400 may obtain coordinate information according to an external input, e.g., a touch event of an object such as a finger or a stylus pen. The input sensing layer 400 may include a touch electrode and trace lines connected to the touch electrode. The input sensing layer 400 may detect the external input by a mutual capacitance method or a self-capacitance method.

An anti-reflection layer 600 may reduce the reflectance of light (external light) incident toward the display panel 10 from the outside. The anti-reflection layer 600 may include a light-shielding layer 610, color filters 620, and an overcoat layer 630. An opening 610OP1 overlapping the light-emitting diode LED of the first display area DA1, and an opening 610OP2 overlapping the light-emitting diode LED of the second display area DA2 may be defined in the light-shielding layer 610, and the color filters 620 may be arranged in the openings 610OP1 and 610OP2, respectively. An opening 610OP3 that does not overlap the light-emitting diode LED may be defined in the light-shielding layer 610. The aforementioned opening 610OP3 is an area corresponding to the transmission area TA, and a portion of the overcoat layer 630 may be disposed in the opening 610OP3.

The window 700 is arranged on the anti-reflection layer 600. The window 700 may be coupled to the anti-reflection layer 600 through an adhesive layer such as an optically transparent adhesive. The window 700 may include a glass material or a plastic material. The glass material may include ultra-thin glass. In an embodiment, the plastic may include polyethersulfone, polyacrylate, polyetherimide, polyethylene naphthalate, PET, polyphenylene sulfide, polyarylate, PI, polycarbonate, or cellulose acetate propionate, for example.

Figure 5:
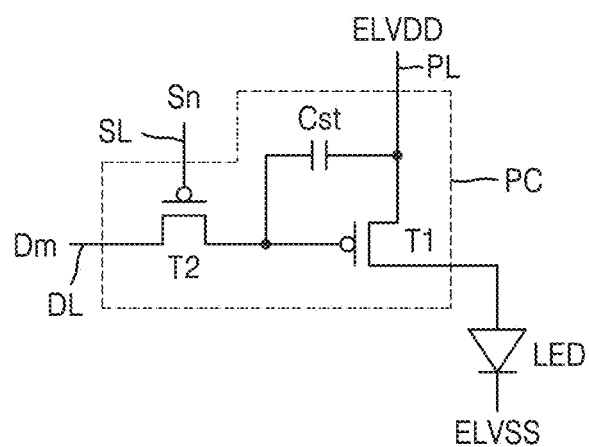
FIG. 5 is an equivalent circuit diagram schematically illustrating an embodiment of a pixel circuit electrically connected to a light-emitting diode of a display panel.

FIG. 5 is an equivalent circuit diagram schematically illustrating an embodiment of a pixel circuit PC electrically connected to a light-emitting diode LED of a display panel.

Referring to FIG. 5, the pixel circuit PC may include a first thin-film transistor T1, a second thin-film transistor T2, and a storage capacitor Cst.

The second thin-film transistor T2 herein also referred to as a switching thin-film transistor is connected to a scan line SL and a data line DL and may transfer, to the first thin-film transistor T1, a data voltage (or a data signal Dm) received via the data line DL according to a switching voltage (or a switching signal Sn) received via the scan line SL. The storage capacitor Cst is connected to the second thin-film transistor T2, and a driving voltage line PL and may store a voltage corresponding to a voltage difference between the data voltage received via the second thin-film transistor T2 and a first power voltage ELVDD applied to the driving voltage line PL.

The first thin-film transistor T1 herein also referred to as a driving thin-film transistor is connected to the driving voltage line PL and the storage capacitor Cst and may control a driving current flowing from the driving voltage line PL to the light-emitting diode LED corresponding to a voltage stored in the storage capacitor Cst. The light-emitting diode LED may emit light having a luminance according to the driving current. An electrode (e.g., a cathode) of the light-emitting diode LED may receive a second power voltage ELVSS. In an embodiment, a voltage level of the second power voltage ELVSS may be less than the first power voltage ELVDD. In an embodiment, the electrode (e.g., a cathode) of the light-emitting diode LED may be connected to the ground and receive a voltage of 0 volt (V).

In FIG. 5, the pixel circuit PC includes two thin-film transistors and one storage capacitor, but the invention is not limited thereto. A number of thin-film transistors and/or a number of storage capacitors may vary according to the design of the pixel circuit PC without deviating from the scope of the invention. In an embodiment, the pixel circuit PC may include three or more thin-film transistors.

Figure 6:
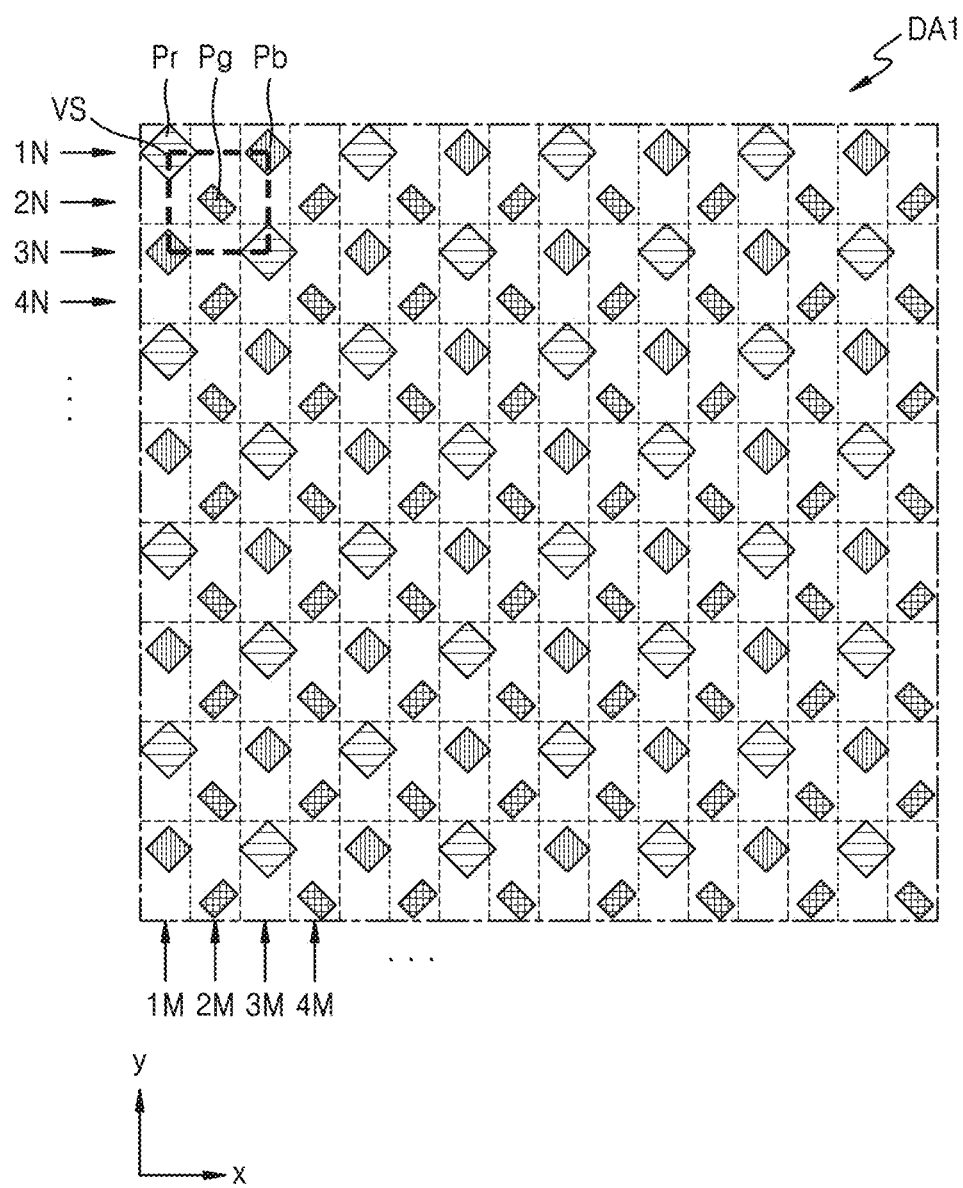
FIG. 6 is a plan view illustrating an embodiment of a part of a first display area of a display panel.

FIG. 6 is a plan view illustrating an embodiment of a part of a first display area DA1 of a display panel.

Referring to FIG. 6, pixels are arranged in the first display area DA1, and the pixels may include first to third pixels that emit light of different colors. Hereinafter, for convenience of explanation, it will be described that the first pixel is a red pixel Pr, the second pixel is a green pixel Pg, and the third pixel is a blue pixel Pb.

The red pixel Pr, the green pixel Pg, and the blue pixel Pb may be arranged in the first display area DA1 according to a pattern. In some embodiments, the red pixel Pr, the green pixel Pg, and the blue pixel Pb may be arranged in a diamond PenTile™ type as shown in FIG. 6.

In an embodiment, a plurality of red pixels Pr and a plurality of blue pixels Pb are alternately arranged in a first row 1N, a plurality of green pixels Pg are arranged at intervals in a second row 2N adjacent to the first row 1N, the blue pixel Pb and the red pixel Pr are alternately arranged in a third row 3N adjacent to the second row 2N, the plurality of green pixels Pg are arranged at intervals in a fourth row 4N adjacent to the third row 3N, and this pixel arrangement is repeated until an n-th row where n is a natural number, for example. In this case, a size (or width) of each of the blue pixel Pb and the red pixel Pr may be greater than a size (or width) of the green pixel Pg.

The plurality of red pixels Pr and the plurality of blue pixels Pb arranged in the first row 1N and the plurality of green pixels Pg arranged in the second row 2N are alternately arranged. Thus, the red pixel Pr and the blue pixel Pb are alternately arranged in a first column 1M, and a plurality of green pixels Pg is arranged at intervals in a second column 2M adjacent to the first column 1M, the blue pixel Pb and the red pixel Pr are alternately arranged in a third column 3M adjacent to the second column 2M, the plurality of green pixel Pg is arranged at intervals in a fourth column 4M adjacent to the third column 3M, and this pixel arrangement is repeated until an m-th column where m is a natural number.

In other words, from among vertices of a virtual quadrilateral VS having a center of the green pixel Pg as a center thereof, the red pixel Pr may be arranged at first and third vertices facing each other, and the blue pixel Pb may be arranged at remaining vertices, that is, second and fourth vertices. Here, the virtual quadrilateral VS may be variously modified as, e.g., a rectangle, a rhombus, a square, etc.

Such a pixel arrangement structure is also referred to as a diamond PenTile™ type, and by applying a rendering drive that expresses colors by sharing adjacent pixels, high resolution may be implemented with a small number of pixels.

The red pixel Pr, the green pixel Pg, and the blue pixel Pb shown in FIG. 6 may emit red light, green light, and blue light, respectively, by light-emitting diodes arranged in corresponding pixels. Thus, an arrangement of the pixels may correspond to an arrangement of the light-emitting diodes that are display elements. In an embodiment, a position of the red pixel Pr shown in FIG. 6 may indicate a position of a light-emitting diode that emits red light, for example. Similarly, a position of the green pixel Pg indicates a location of a light-emitting diode emitting green light, and a location of the blue pixel Pb indicates a location of the light-emitting diode emitting blue light.

Figure 7A:
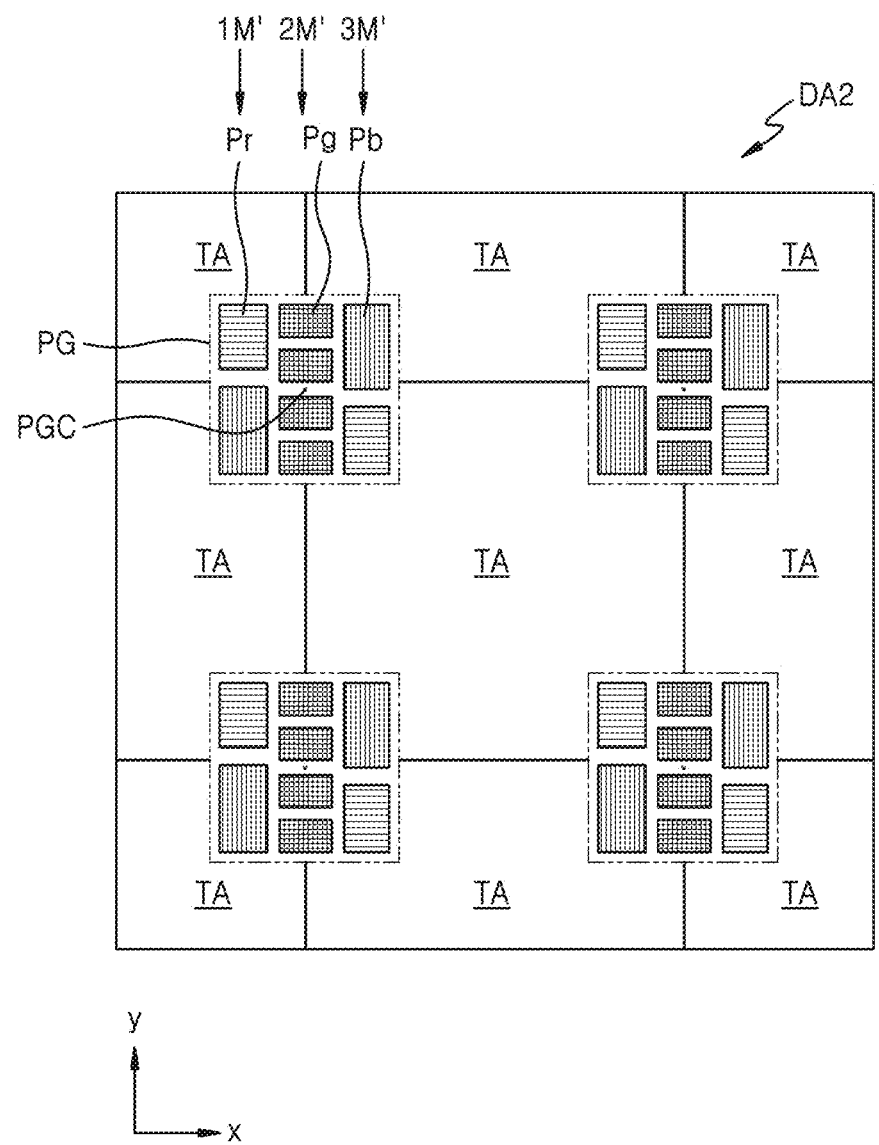
FIGS. 7A and 7B are plan views illustrating an embodiment of a part of a second display area of a display panel.
Figure 7B:
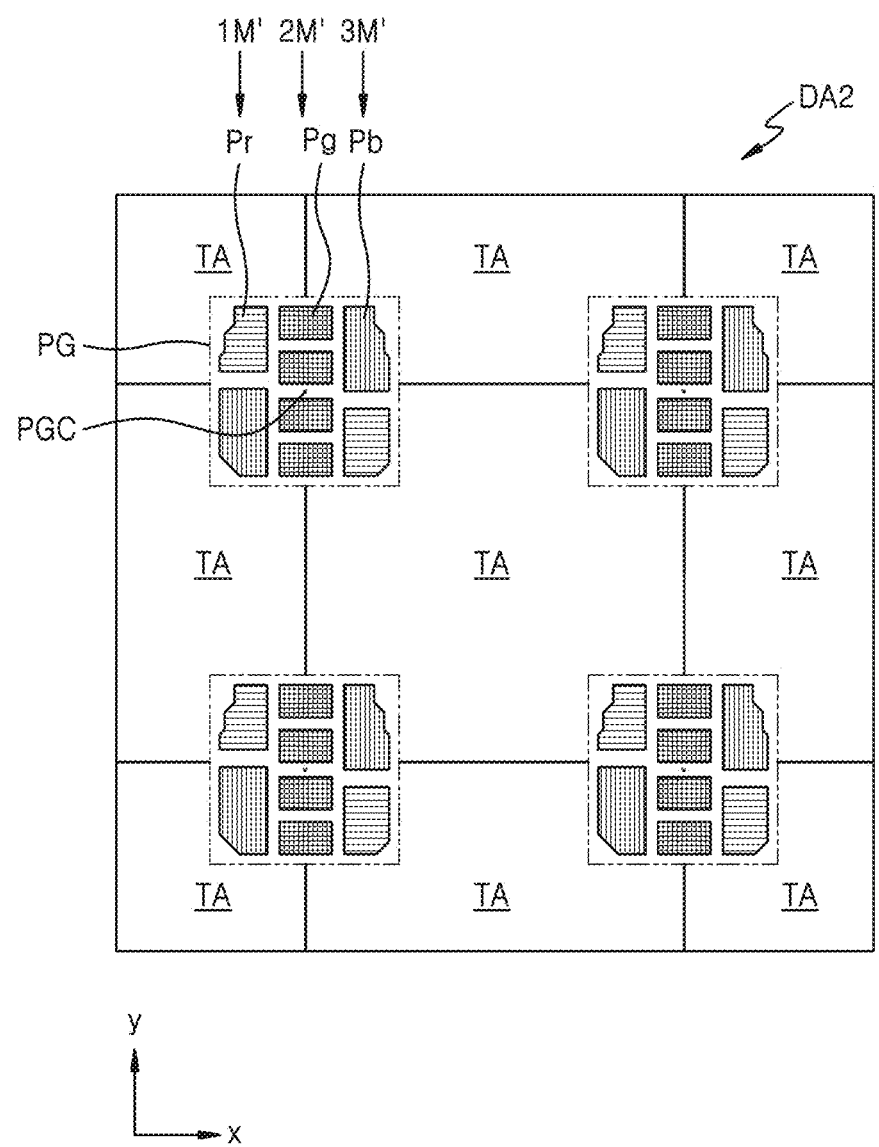

FIGS. 7A and 7B are plan views illustrating an embodiment of a part of a second display area DA2 of a display panel.

Referring to FIGS. 7A and 7B, pixel groups PG may be spaced apart from each other in the second display area DA2. Each of the pixel groups PG may be surrounded by transmission areas TA, and may include pixels emitting light of different colors, e.g., a red pixel Pr, a green pixel Pg, and a blue pixel Pb. In an embodiment, each of the pixel groups PG may include two red pixels Pr, four green pixels Pg, and two blue pixels Pb.

As described above with reference to FIG. 6, the red pixel Pr, the green pixel Pg, and the blue pixel Pb may emit red light, green light, and blue light, respectively, by light-emitting diodes arranged in corresponding pixels, and thus, an arrangement of the pixels may correspond to an arrangement of light-emitting diodes that are display elements. Therefore, the pixel group PG described with reference to FIGS. 7A and 7B may correspond to a display element group including a light-emitting diode emitting red light, a light-emitting diode emitting green light, and a light-emitting diode emitting blue light. In an embodiment, when the pixel groups PG each including the red pixel Pr, the green pixel Pg, and the blue pixel Pb are separated from each other, display element groups including light-emitting diodes respectively emitting red light, green light, and blue light may be separated from each other, for example.

The pixel group PG may be symmetrically arranged with respect to a center PGC of the pixel group PG. In an embodiment, the red pixel Pr and the blue pixel Pb may be arranged in a first column 1M', and four green pixels Pg may be spaced apart from each other at intervals in a second column 2M', for example. In addition, the blue pixel Pb and the red pixel Pr may be arranged in a third column 3M'. In this case, the red pixel Pr arranged in the first column 1M' and the red pixel Pr arranged in the third column 3M' may be symmetrically arranged with respect to the center PGC of the pixel group PG. The blue pixel Pb arranged in the first column 1M' and the blue pixel Pb arranged in the third column 3M' may be symmetrically arranged with respect to the center PGC of the pixel group PG. The green pixels Pg arranged in the second column 2M' may be symmetrically arranged with respect to the center PGC of the pixel group PG.

In an embodiment, a length of the blue pixel Pb in a y direction may be greater than a length of the red pixel Pr in they direction. The length of the blue pixel Pb in the y direction may be equal to or greater than a sum of lengths of two green pixels Pg in the y-direction.

Referring to FIG. 7A, each of the red pixel Pr, the green pixel Pg, and the blue pixel Pb may be substantially quadrilateral in a plan view. In an embodiment, each of the red pixel Pr and the blue pixel Pb may have a quadrilateral shape having a short side in an x direction and a long side in the y direction, for example. The green pixel Pg may have a quadrilateral shape having a long side in the x direction and a short side in the y direction.

In another embodiment, at least one of the red pixel Pr, the green pixel Pg, and the blue pixel Pb may be an n-polygon (n is a positive integer of 5 or more). In an embodiment, as shown in FIG. 7B, the green pixel Pg may be a quadrilateral, but an edge of each of the red pixel Pr and the blue pixel Pb adjacent to the transmission area TA may be bent at least once, and thus, each of the red pixel Pr and the blue pixel Pb may have an n-polygon (n is a positive integer of 5 or more) shape, for example.

Figure 8:
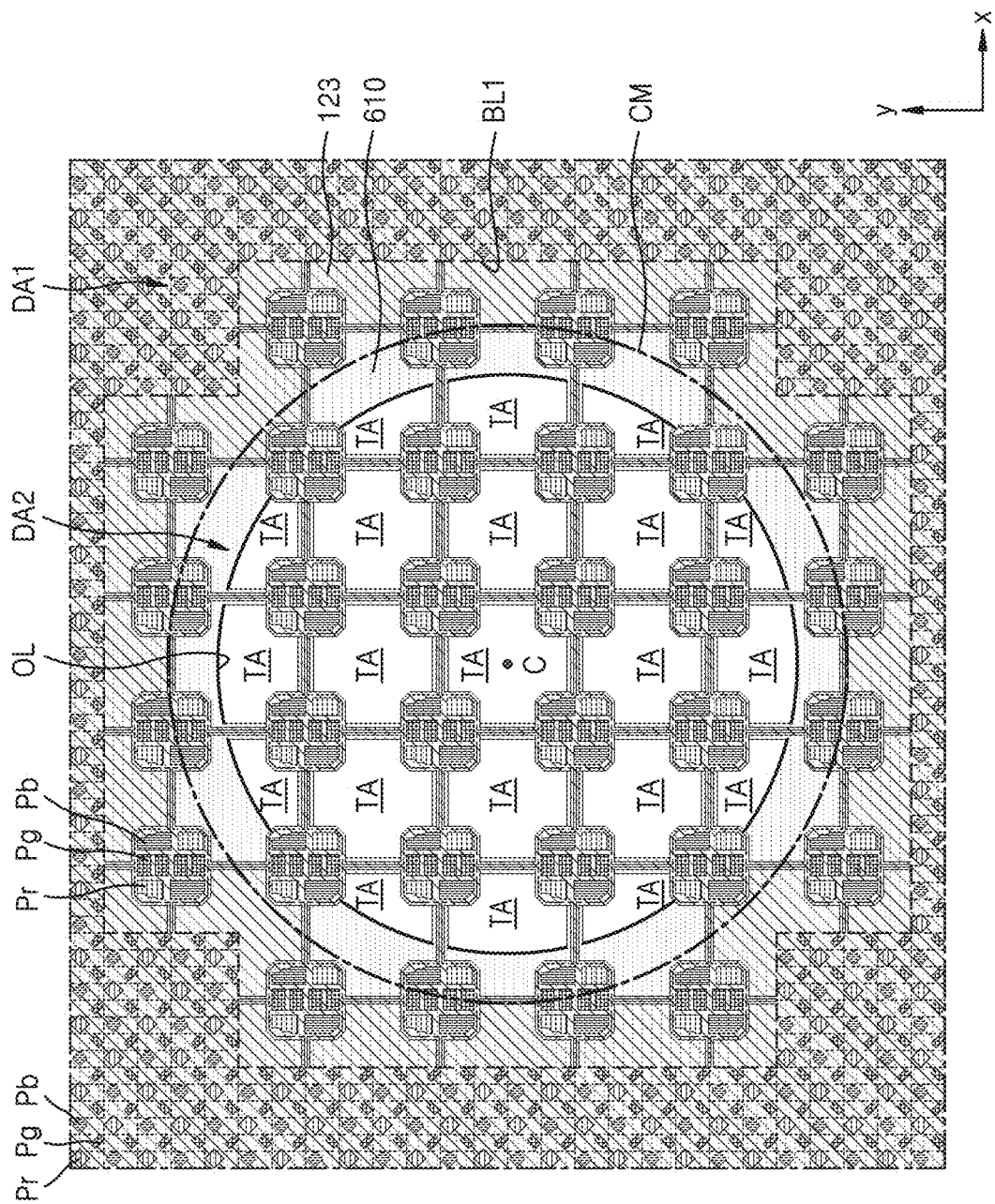
FIG. 8 is a plan view illustrating an embodiment of a second display area of a display panel and a first display area around the second display area.
Figure 9:
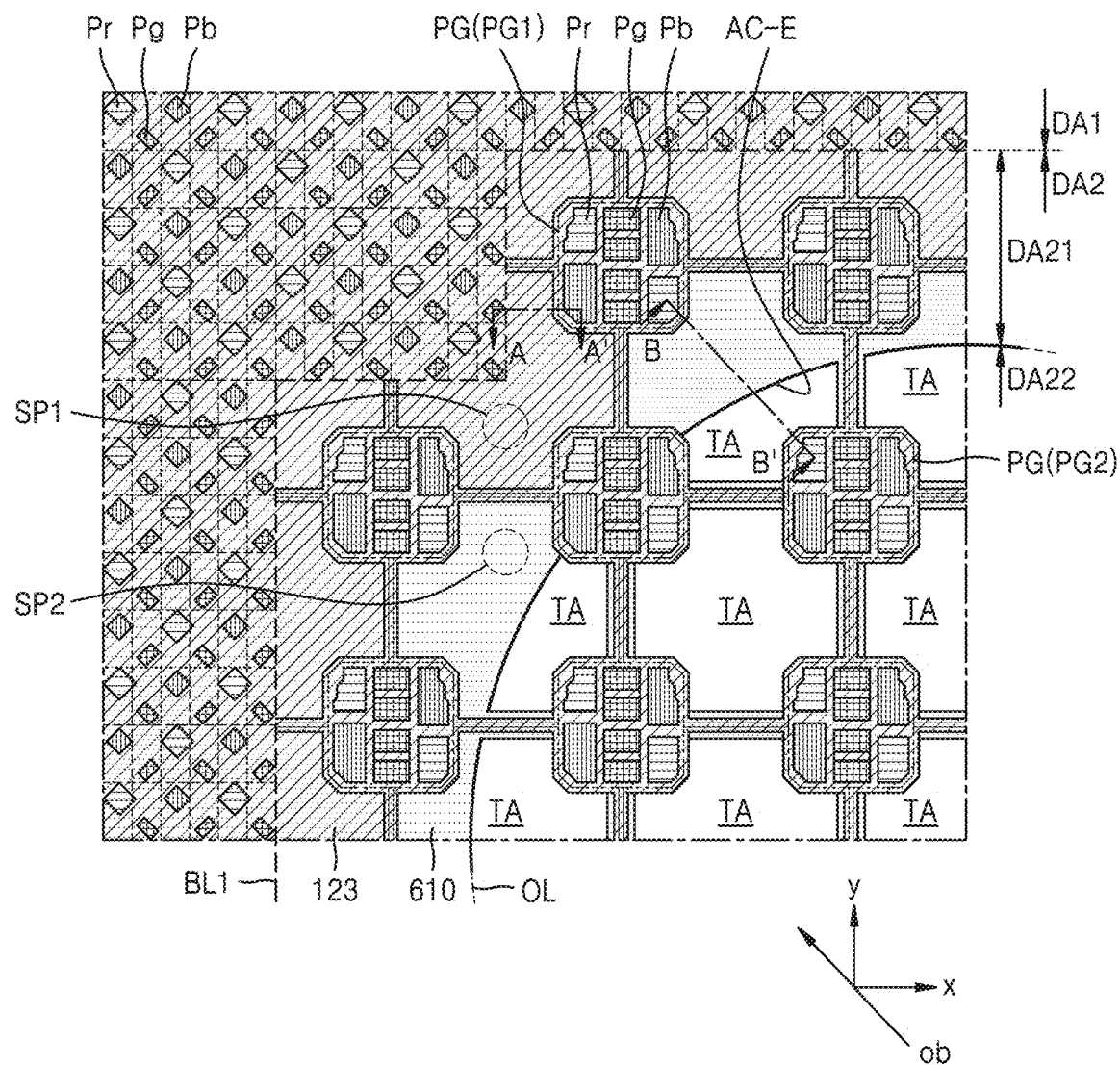
FIG. 9 is a plan view illustrating a part of FIG. 8.

FIG. 8 is a plan view illustrating a second display area DA2 of a display panel and a first display area DA1 therearound, in an embodiment, and FIG. 9 is a plan view illustrating a part of the display panel in FIG. 8.

Referring to FIGS. 8 and 9, red, green, and blue pixels Pr, Pg, and Pb are arranged in the first display area DA1 and the second display area DA2. An arrangement of the red, green, and blue pixels Pr, Pg, and Pb in the first display area DA1 may be same as or different from an arrangement of the red, green, and blue pixels Pr, Pg, and Pb in the second display area DA2. In an embodiment, FIGS. 8 and 9 illustrate that the arrangement of pixels in the first display area DA1 and the arrangement of pixels in the second display area DA2 are different from each other, and a detailed structure thereof is as described above with reference to FIGS. 6, 7A, and 7B. In another embodiment, the red, green, and blue pixels Pr, Pg, and Pb arranged in each of the pixel groups PG of the second display area DA2 may have a diamond PenTile™ structure as described above with reference to FIG. 7.

A borderline BL1 between the first display area DA1 and the second display area DA2 may have a polygonal shape as shown in FIG. 8 in a plan view. In an embodiment, FIG. 8 illustrates that the borderline BL1 is a polygon (e.g., having an approximately cross-shape) having twelve sides, and a corner portion of the above-described polygon may have a step configuration. In another embodiment, a number of sides provided by the borderline BL1 may be less than or greater than 12. In an embodiment, the borderline BL1 between the first display area DA1 and the second display area DA2 may have four sides like a quadrilateral, or may be a polygon having more than twelve sides, for example.

Referring to FIG. 9, the pixels in the first display area DA1 and the pixels in the second display area DA2 are spaced apart from each other by a distance, which may be greater than a distance between adjacent pixels arranged in the first display area DA1 and may be greater than a distance between adjacent pixels arranged in one pixel group PG in the second display area DA2. Cross-sectional structures of the pixels arranged in the first and second display areas DA1 and DA2 will be described in corresponding portions with reference to FIG. 10.

A transmission area TA may be disposed in the second display area DA2, and an outermost line OL of the transmission area TA may have a round (or curved) shape in a plan view. In an embodiment, the outermost line OL of the transmission area TA may have an overall, or substantially, circular or elliptical shape as shown in FIG. 8, for example.

The outermost line OL of the transmission area TA may be defined by an edge of a layer including a light-shielding material. The display panel may include a light-shielding insulating layer 123 and a light-shielding layer 610 that include a light-shielding material. The light-shielding insulating layer 123 is a layer that includes a light-shielding material and defines a light-emitting area of light-emitting diodes. The light-shielding layer 610 is included in an anti-reflection layer and includes a light-shielding material. The outermost line OL of the transmission area TA may be defined by a curved edge (e.g., an arc edge) of one or two selected from among the light-shielding insulating layer 123 and the light-shielding layer 610. In other words, the curved edge of at least one of the light-shielding insulating layer 123 and the light-shielding layer 610 may define the outermost line OL of the transmission area TA. In an embodiment, FIGS. 8 and 9 illustrate that the outermost line OL of the transmission area TA is defined by a curved edge AC-E of the light-shielding layer 610.

The transmission area TA is an area through which light and/or sound may transmit, as described above with reference to FIG. 4, and a component CM may be arranged to overlap the transmission area TA as indicated by a dotted line in FIG. 8. A width (or diameter) of the component CM may be greater than a width (or diameter, or length of minor axis, or length of major axis) of a circular or elliptical shape defined by the outermost line OL shown in FIG. 8.

In a plan view, an area surrounded by the outermost line OL may be smaller than an area surrounded by the borderline BL1 that is disposed between the first display area DA1 and the second display area DA2. As illustrated in FIG. 9, the second display area DA2 may include a second outer display area DA21 and a second inner display area DA22, where the second outer display area DA21 is disposed on the outside of the outermost line OL, and the second inner display area DA22 is disposed on the inside of the outermost line OL. Some areas between neighboring pixel groups PG in the second outer display area DA21 may overlap the light-shielding insulating layer 123 and the light-shielding layer 610, and other areas may overlap one from among the light-shielding insulating layer 123 and the light-shielding layer 610. In this regard, FIG. 9 illustrates that a first area SP1 of the second outer display area DA21 overlaps all of the light-shielding insulating layer 123 and the light-shielding layer 610, whereas a second area SP2 overlaps one selected from the light-shielding insulating layer 123 and the light-shielding layer 610, that is, the light-shielding layer 610.

A transmission area TA may be arranged in the second inner display area DA22. Referring to FIG. 9, the transmission area TA may be arranged between a pixel (a red pixel Pr) of a first pixel group PG1 and a pixel (a red pixel Pr) of a second pixel group PG2, where the first pixel group PG1 and the second pixel group PG2 are arranged in an ob direction crossing the curved edge AC-E. Because a light-emitting diode is disposed in a pixel, the transmission area TA may be regarded as being disposed between a light-emitting diode of one display element group and a light-emitting diode of another display element group. The ob direction in FIG. 9 is a direction that crosses x and y directions, and may correspond to a radial direction toward a center C (refer to FIG. 8) of a circle (or an ellipse) defined by an outermost line OL.

A planar shape of the transmission area TA arranged close to the outermost line OL may be different from a planar shape of the transmission area TA arranged far from the outermost line OL. In an embodiment, referring to FIGS. 8 and 9, the transmission area TA arranged far from the outermost line OL may have an approximately cross shape, whereas one edge of the transmission area TA arranged close to the outermost line OL may be round. In an embodiment, in a plan view, the transmission area TA arranged closest to the outermost line OL may have a closed-curve shape including a curved edge, for example.

Figure 10:
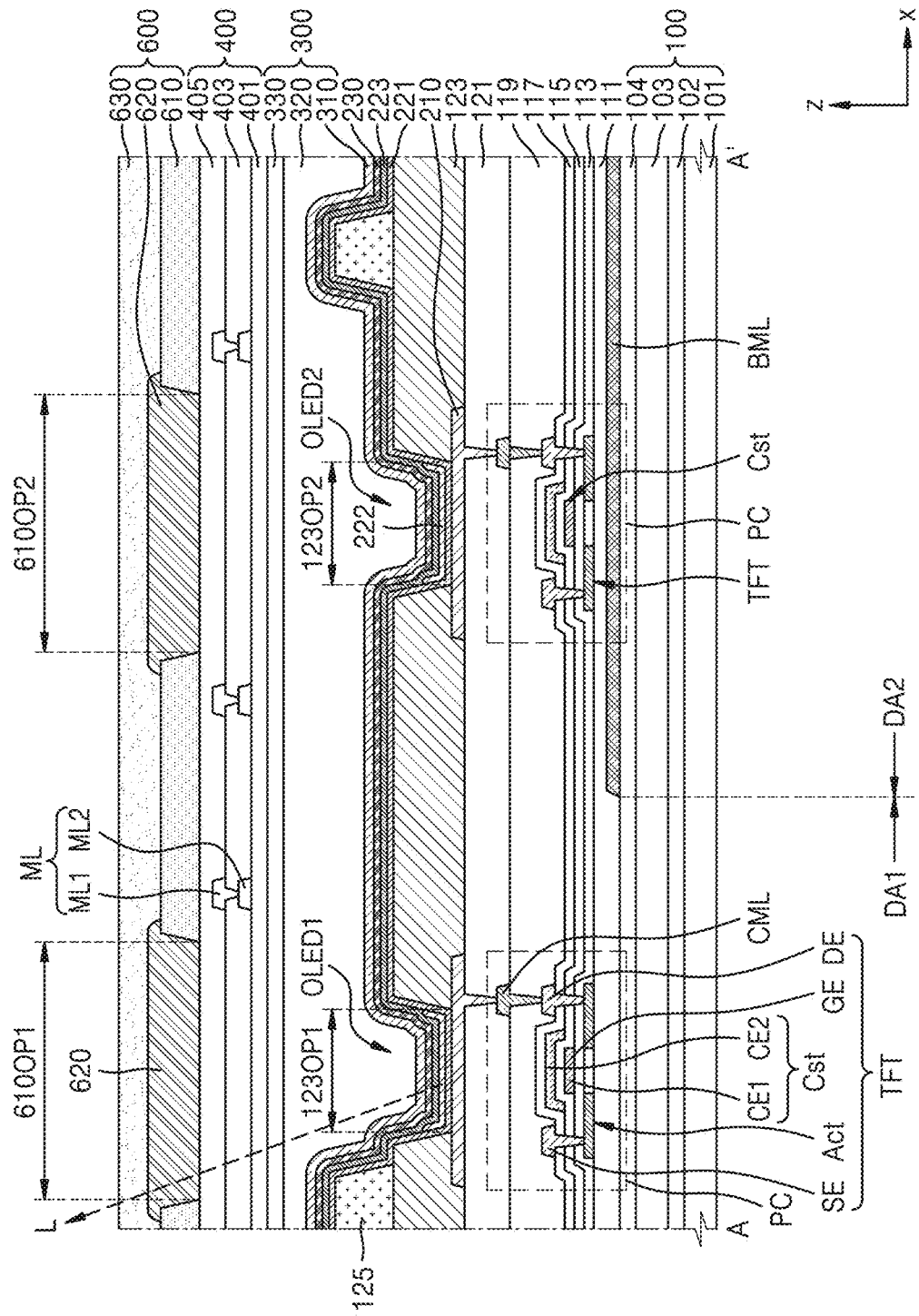
FIG. 10 is a cross-sectional view of an embodiment of the display panel in FIG. 9, taken along line A-A'.

FIG. 10 is a cross-sectional view of an embodiment of a display panel in FIG. 9, taken along line A-A'. FIG. 10 illustrates a case where a light-emitting diode of a display panel includes an organic light-emitting diode. An organic light-emitting diode may be arranged as a light-emitting diode in each of first and second display areas DA1 and DA2, and for convenience of explanation, an organic light-emitting diode arranged in the first display area DA1 will be also referred to as a first organic light-emitting diode OLED1, and an organic light-emitting diode arranged in the second display area DA2 will be also referred to as a second organic light-emitting diode OLED2.

Referring to FIG. 10, the first organic light-emitting diode OLED1 and the second organic light-emitting diode OLED2 are disposed on a substrate 100.

The substrate 100 may include a first base layer 101, a first barrier layer 102, a second base layer 103, and a second barrier layer 104. Each of the first base layer 101 and the second base layer 103 may include a polymer resin, and each of the first barrier layer 102 and the second barrier layer 104 may include an inorganic insulating material. In an embodiment, the polymer resin may include polyethersulfone, polyacrylate, polyetherimide, polyethylene naphthalate, PET, polyphenylene sulfide, polyarylate, PI, polycarbonate, and/or cellulose acetate propionate, for example.

A buffer layer 111 is arranged on the substrate 100. The buffer layer 111 may reduce or block the penetration of foreign matter, moisture or ambient air from a bottom portion of the substrate 100. The buffer layer 111 may include an inorganic insulating material such as silicon oxide, silicon oxynitride, or silicon nitride, and may have a single or multi-layered structure including the above material.

A blocking metal layer BML may be disposed between the substrate 100 and the buffer layer 111, and may be disposed in the second display area DA2. The blocking metal layer BML may prevent light proceeding to the component CM (refer to FIG. 8) arranged in the second display area DA2 or light emitted from the component CM (refer to FIG. 8) from affecting an electronic element such as a thin-film transistor TFT of the pixel circuit PC. The blocking metal layer BML may include conductive metal such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

The first organic light-emitting diode OLED1 and the second organic light-emitting diode OLED2 may be electrically connected to the pixel circuits PC, respectively. The first organic light-emitting diode OLED1 may be electrically connected to the pixel circuit PC between the substrate 100 and the first organic light-emitting diode OLED1, and the second organic light-emitting diode OLED2 may be electrically connected to the pixel circuit PC between the substrate 100 and the second organic light-emitting diode OLED2.

The pixel circuit PC may include the thin-film transistor TFT and a storage capacitor Cst. The thin-film transistor TFT may include a semiconductor layer Act, a gate electrode GE, a source electrode SE, and a drain electrode DE, where the gate electrode GE overlaps a channel area of the semiconductor layer Act, and the source electrode SE and the drain electrode DE are connected to a source area and a drain area of the semiconductor layer Act, respectively. A gate insulating layer 113 may be disposed between the semiconductor layer Act and the gate electrode GE, and a first interlayer insulating layer 115 and a second interlayer insulating layer 117 may be disposed between the gate electrode GE and the source electrode SE or between the gate electrode GE and the drain electrode DE.

A storage capacitor Cst may be arranged to overlap the thin-film transistor TFT. The storage capacitor Cst may include a lower electrode CE1 and an upper electrode CE2 overlapping each other. In some embodiments, the gate electrode GE of the thin-film transistor TFT may include the lower electrode CE1 of the storage capacitor Cst. The first interlayer insulating layer 115 may be arranged between the lower electrode CE1 and the upper electrode CE2.

The semiconductor layer Act may include polysilicon. In some embodiments, the semiconductor layer Act may include amorphous silicon. In some embodiments, the semiconductor layer Act may include an oxide semiconductor of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), or zinc (Zn). The semiconductor layer Act may include the channel area, the source area, and the drain area, where the source area and the drain area are doped with impurities.

In an embodiment, the gate insulating layer 113 may include an inorganic insulating material such as silicon oxide, silicon oxynitride, or silicon nitride, and may have a single or multi-layered structure including the above material.

In an embodiment, the gate electrode GE or the lower electrode CE1 may include a low-resistance conductive material such as Mo, Al, Cu, and/or Ti, and may have a single layer or multi-layered structure having the above-described material.

In an embodiment, the first interlayer insulating layer 115 may include an inorganic insulating material such as silicon oxide, silicon oxynitride, or silicon nitride, and may have a single or multi-layered structure including the above material.

In an embodiment, the upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layered structure including the above materials.

In an embodiment, the second interlayer insulating layer 117 may include an inorganic insulating material such as silicon oxide, silicon oxynitride, or silicon nitride, and may have a single or multi-layered structure including the above material.

In an embodiment, the source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single-layered or multi-layered structure including the above materials. In an embodiment, each of the source electrode SE or the drain electrode DE may have a three-layer structure including a Ti layer, an Al layer, and another Ti layer, for example.

A first organic insulating layer 119 is disposed on the thin-film transistor TFT, and the thin-film transistor TFT may be electrically connected to a first electrode 210 of a corresponding organic light-emitting diode through a connection electrode layer CML arranged on the first organic insulating layer 119. The connection electrode layer CML may be connected to the thin-film transistor TFT through a contact hole in the first organic insulating layer 119, and the first electrode 210 may be connected to the connection electrode layer CML through a contact hole in a second organic insulating layer 121.

Each of the first organic insulating layer 119 and/or the second organic insulating layer 121 may include an organic insulating material such as acryl, benzocyclobutene ("BCB"), PI, hexamethyldisiloxane ("HMDSO"), or the like. In some embodiments, the connection electrode layer CML and the second organic insulating layer 121 may be omitted, in which case the first electrode 210 may be directly connected to the thin-film transistor TFT through the contact hole of the first organic insulating layer 119.

Each of the first organic light-emitting diode OLED1 and the second organic light-emitting diode OLED2 may include an overlapping structure of the first electrode 210, an emission layer 222, and a second electrode 230. The above-described overlapping structure may include a first functional layer 221 between the first electrode 210 and the emission layer 222 and/or a second functional layer 223 between the emission layer 222 and the second electrode 230.

The first electrode 210 may be disposed on the second organic insulating layer 121. The first electrode 210 may be an anode electrode. In an embodiment, the first electrode 210 may include a reflective film including silver (Ag), magnesium (Mg), aluminum (Al), platinum (Pt), palladium (Pd), gold (Au), nickel (Ni), neodymium (Nd), iridium (Ir), chrome (Cr), or any compounds thereof. The first electrode 210 may include a reflective film including the aforementioned materials, and a transparent conductive film arranged above and/or below the reflective film. In an embodiment, the transparent conductive film may include indium tin oxide ("ITO"), indium zinc oxide ("IZO"), zinc oxide (ZnO), indium oxide ($In_2O_3$), indium gallium oxide ("IGO"), and/or aluminum zinc oxide ("AZO"). In an embodiment, the first electrode 210 may have a three-layer structure of an ITO layer, an Ag layer, and another ITO layer.

A light-shielding insulating layer 123 covers an edge of the first electrode 210 and an opening overlapping the first electrode 210 may be defined in the light-shielding insulating layer 123. In this regard, FIG. 10 illustrates an opening overlapping the first electrode 210 of the first organic light-emitting diode OLED1 (hereinafter referred to as a first opening 123OP1), and an opening overlapping the first electrode 210 of the second organic light-emitting diode OLED2 (hereinafter referred to as a second opening 123OP2).

The first opening 123OP1 and the second opening 123OP2 of the light-shielding insulating layer 123 may define light-emitting areas of the first and second organic light-emitting diodes OLED1 and OLED2, respectively. In an embodiment, a width of the first opening 123OP1 of the light-shielding insulating layer 123 may correspond to a width of the light-emitting area of the first organic light-emitting diode OLED1, and a width of the second opening 123OP2 of the light-shielding insulating layer 123 may correspond to a width of the light-emitting area of the second organic light-emitting diode OLED2, for example.

The light-shielding insulating layer 123 is a colored insulating layer, and for example, may be black. In an embodiment, the light-shielding insulating layer 123 may include a PI-based binder, and a pigment in which red, green, and blue are mixed, for example. In some embodiments, the light-shielding insulating layer 123 may include a combination of a cardo-based binder resin, a lactam black pigment, and a blue pigment. In some embodiments, the light-shielding insulating layer 123 may include carbon black. The light-shielding insulating layer 123, together with the anti-reflection layer 600 to be described below, may prevent the reflection of external light and improve the contrast of the display panel.

The spacer 125 may be arranged on the light-shielding insulating layer 123. The spacer 125 may include a material different from a material of the light-shielding insulating layer 123. In an embodiment, the light-shielding insulating layer 123 may include a negative photosensitive material, whereas the spacer 125 may include a positive photosensitive material, and may be provided through separate mask processes, for example.

The emission layer 222 is disposed to correspond to each of the first opening 123OP1 and the second opening 123OP2 of the light-shielding insulating layer 123, and may overlap the first electrode 210. The emission layer 222 may include a polymer organic material or a low-molecular-weight organic material emitting light of a color. The first functional layer 221 may be disposed below the emission layer 222, and the second functional layer 223 may be disposed above the emission layer 222.

The first functional layer 221 may include a hole transport layer ("HTL") and/or a hole injection layer ("HIL"). The second functional layer 223 may include an electron transport layer ("ETU") and/or an electron injection layer ("EIL"). Unlike the emission layer 222, the first functional layer 221 and/or the second functional layer 223 may be entirely disposed on the substrate 100. In other words, the first functional layer 221 and/or the second functional layer 223 may cover the first display area DA1 and the second display area DA2.

An encapsulation layer 300 may cover the first and second organic light-emitting diodes OLED1 and OLED2. In an embodiment, the encapsulation layer 300 may include a first inorganic encapsulation layer 310, a second inorganic encapsulation layer 330, and an organic encapsulation layer 320 therebetween.

Each of the first and second inorganic encapsulation layers 310 and 330 may include one or more inorganic insulating materials. In an embodiment, the inorganic insulating materials may include aluminum oxide, titanium oxide, tantalum oxide, hafnium oxide, zinc oxide, silicon oxide, silicon nitride, and/or silicon oxynitride.

The organic encapsulation layer 320 may include a polymer-based material. In an embodiment, the polymer-based material may include acryl-based resins, epoxy-based resins, PI, polyethylene, and the like. In an embodiment, the organic encapsulation layer 320 may include an acryl-based resin, e.g., polymethyl methacrylate or polyacrylic acid. The organic encapsulation layer 320 may be provided by curing a monomer or coating a polymer.

An input sensing layer 400 may include a touch electrode, which may include a metal line ML. The touch electrode may include the metal line ML having a mesh structure surrounding the light-emitting areas of the first and second organic light-emitting diodes OLED1 and OLED2 in a plan view. The metal line ML may include a connection structure of a first metal layer ML1 and the second metal layer ML2 as shown in FIG. 9. In another embodiment, the metal line ML may include one from among the first metal layer ML1 and the second metal layer ML2. In an embodiment, the metal line ML may include molybdenum (Mo), mendelevium (Mb), silver (Ag), titanium (Ti), copper (Cu), aluminum (Al), and any alloys thereof. An electrode of the input sensing layer 400, e.g., the metal line ML, may be covered with a light-shielding layer 610.

The input sensing layer 400 may include a first touch insulating layer 401 on the encapsulation layer 300, a second touch insulating layer 403 on the first touch insulating layer 401, and a third touch insulating layer 405 on the second touch insulating layer 403. The first metal layer ML1 may be disposed between the first touch insulating layer 401 and the second touch insulating layer 403, and the second metal layer ML2 may be disposed between the second touch insulating layer 403 and the third touch insulating layer 405.

Each of the first to third touch insulating layers 401, 403, and 405 may include an inorganic insulating material and/or an organic insulating material. In an embodiment, each of the first touch insulating layer 401 and the second touch insulating layer 403 may include an inorganic insulating material, and the third touch insulating layer 405 may include an organic insulating material.

Openings respectively overlapping the light-emitting areas of the first and second organic light-emitting diodes OLED1 and OLED2 may be defined in The light-shielding layer 610 of the anti-reflection layer 600. In this regard, FIG. 10 illustrates an opening (hereinafter referred to as the fourth opening 610OP1) overlapping the light-emitting area of the first organic light-emitting diode OLED1 and/or the first opening 123OP1 of the light-shielding insulating layer 123, and an opening (hereinafter referred to as the fifth opening 610OP2) overlapping the light-emitting area of the organic light-emitting diode OLED2 and/or the second opening 123OP2 of the light-shielding insulating layer 123.

A width of the fourth opening 610OP1 of the light-shielding layer 610 may be equal to or greater than a width of the light-emitting area of the first organic light-emitting diode OLED1 and/or the first opening 123OP1 of the light-shielding insulating layer 123. In this regard, FIG. 10 illustrates that the width of the fourth opening 610OP1 of the light-shielding layer 610 is greater than the width of the light-emitting area of the first organic light-emitting diode OLED1 and/or the first opening 123OP1 of the light-shielding insulating layer 123. In this case, light L reaching naked eyes of a user forming an acute angle with an upper surface of the anti-reflection layer 600 may be secured, and thus, the side visibility of the display panel may be improved.

Similarly, a width of the fifth opening 610OP2 of the light-shielding layer 610 may be equal to or greater than a width of the light-emitting area of the second organic light-emitting diode OLED2 and/or the width of the second opening 123OP2 of the light-shielding insulating layer 123. In this regard, FIG. 10 illustrates that the width of the fifth opening 610OP2 of the light-shielding layer 610 is greater than the width of the light-emitting area of the second organic light-emitting diode OLED2 and/or the width of the second opening 123OP2 of the light-shielding insulating layer 123.

A color filter 620 may be disposed in each of the fourth opening 610OP1 and the fifth opening 610OP2 of the light-shielding layer 610. Each color filter 620 may be in a same color as a color of light emitted from a light-emitting diode arranged under a corresponding color filter 620. In an embodiment, as shown in FIG. 10, when any one first organic light-emitting diode OLED1 in the first display area DA1 emits green light, the color filter 620 arranged in the fourth opening 610OP1 to overlap the aforementioned first organic light-emitting diode OLED1 may include a green color filter, for example. Similarly, as shown in FIG. 10, when any one second organic light-emitting diode OLED2 of the second display area DA2 emits blue light, the color filter 620 arranged in the fifth opening 610OP2 to overlap the aforementioned second organic light-emitting diode OLED2 may include a blue color filter.

An overcoat layer 630 may be arranged on the light-shielding layer 610 and the color filter 620. The overcoat layer 630 is a light-transmitting layer that does not have a color in a visible light band, and may flatten an upper surface of the light-shielding layer 610 and an upper surface of the color filter 620. The overcoat layer 630 may include a light-transmitting organic material such as an acryl-based resin.

Figure 11:
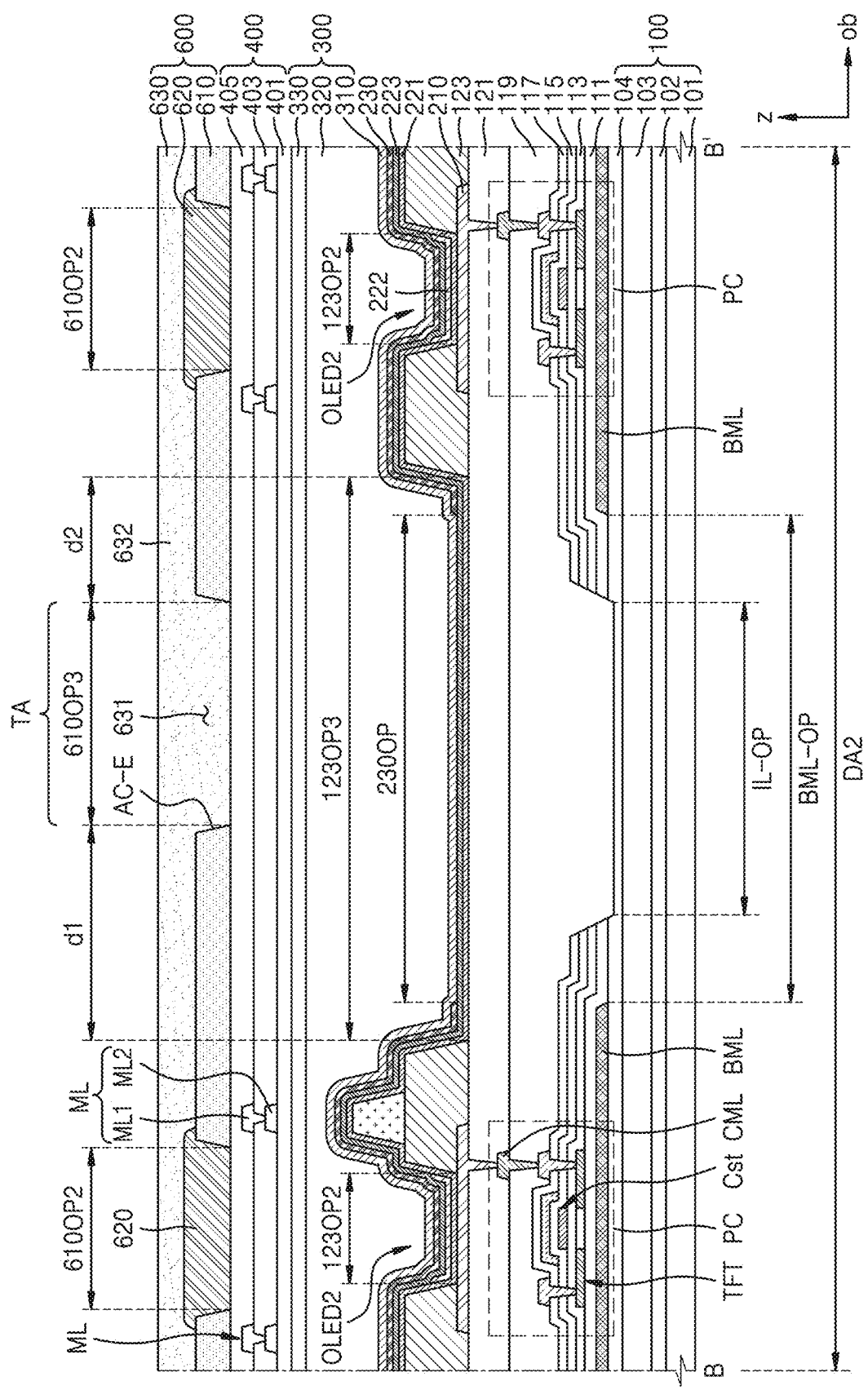
FIG. 11 is a cross-sectional view of an embodiment of the display panel in FIG. 9, taken along line B-B'.

FIG. 11 is a cross-sectional view of the display panel in FIG. 9, taken along line B-B', in an embodiment, illustrating a transmission area arranged at an outer periphery of a plurality of transmission areas and a cross-sectional structure around the transmission area in an embodiment, as shown in FIG. 9.

Referring to FIG. 11, a transmission area TA may be arranged between two adjacent second organic light-emitting diodes OLED2 from among a plurality of second organic light-emitting diodes OLED2 arranged in the second display area DA2. The second organic light-emitting diodes OLED2 may be electrically connected to pixel circuits PC, respectively. The pixel circuit PC on the substrate 100 includes a thin-film transistor TFT and a storage capacitor Cst, and the second organic light-emitting diode OLED2 may have an overlapping structure of a first electrode 210, an emission layer 222, and a second electrode 230 and may be covered with an encapsulation layer 300. As described above, an input sensing layer 400 and an anti-reflection layer 600 may be arranged on the encapsulation layer 300.

An opening corresponding to the transmission area TA (hereinafter referred to as the third opening 123OP3) may be defined in a light-shielding insulating layer 123, and an opening corresponding to the transmission area TA (hereinafter referred to as the sixth opening 610OP3) may be defined in a light-shielding layer 610. A part of an overcoat layer 630 may be disposed in the sixth opening 610OP3. In an embodiment, a first portion 631 of the overcoat layer 630 may at least partially fill the sixth opening 610OP3, and a second portion 632, which is provided as a single body with the first portion 631, may entirely cover the light-shielding layer 610 and color filters 620, for example.

The sixth opening 610OP3 overlaps the third opening 123OP3, but a size (or width) of the sixth opening 610OP3 may be less than a size (or width) of the third opening 123OP3. In other words, a part of the third opening 123OP3 may be covered with a part of the light-shielding layer 610 arranged on one side of a curved edge AC-E.

Referring to FIGS. 9 and 11, the transmission area TA adjacent to the curved edge AC-E may be defined by the sixth opening 610OP3 of the light-shielding layer 610. Edges of the light-shielding layer 610 arranged at both sides of the sixth opening 610OP3 shown in FIG. 11 are spaced apart from edges of the light-shielding insulating layer 123 arranged at both sides with respect to the third opening 123OP3, respectively, and the spacing distances may be different from each other. In an embodiment, an edge of the light-shielding layer 610 arranged on a left side of the sixth opening 610OP3 shown in FIG. 11, e.g., the curved edge AC-E, may be spaced apart by a first distance d1 from an edge of the light-shielding insulating layer 123 arranged on a left side of the third opening 123OP3, and an edge of the light-shielding layer 610 arranged on a right side of the sixth opening 610OP3 may be spaced apart by a second distance d2 from an edge of the light-shielding insulating layer 123 arranged on a right side of the third opening 123OP3. In this case, the first distance d1 may be greater than the second distance d2, and a part of the third opening 123OP3 may overlap the sixth opening 610OP3, but the remaining part may be covered with the light-shielding layer 610.

First and second functional layers 221 and 223 may also exist in a portion corresponding to the transmission area TA. An opening corresponding to the transmission area TA (hereinafter referred to as the seventh opening 230OP) may be defined in the second electrode 230 including a metal element. Transmittance of the transmission area TA may be improved by the seventh opening 230OP. A size (or width) of the seventh opening 230OP of the second electrode 230 may be less than a size (or width) of the third opening 123OP3.

An opening corresponding to the transmission area TA may be also defined in some insulating layers (e.g., inorganic insulating layers) from among insulating layers arranged under the first electrode 21. In an embodiment, a stack of a second barrier layer 104, a buffer layer 111, a gate insulating layer 113, a first interlayer insulating layer 115, and a second interlayer insulating layer 117 may include an inorganic insulating material, and an opening corresponding to the transmission area TA (hereinafter referred to as the eighth opening IL-OP) may be defined in the above-described stack, for example. A part of a first organic insulating layer 119 arranged on the above-described stack may exist in the eighth opening IL-OP. FIG. 11 illustrates that the eighth opening IL-OP includes an overlapping structure of through-holes and a blind hole of the second barrier layer 104, where the through-holes penetrate through the buffer layer 111, the gate insulating layer 113, the first interlayer insulating layer 115, and the second interlayer insulating layer 117. In another embodiment, the eighth opening IL-OP may not define a blind hole in the second barrier layer 104.

An opening overlapping the transmission area TA (hereinafter referred to as the ninth opening BML-OP) may be defined in a blocking metal layer BML arranged between the substrate 100 and the pixel circuit PC, and a size (or width) of the ninth opening BML-OP may be greater than a size (or width) of the eighth opening IL-OP of the stack of insulating layers. The size (or width) of the ninth opening BML-OP may be less than the size (or width) of the third opening 123OP3.

Edges of the blocking metal layer BML that define the ninth opening BML-OP are arranged closer to the transmission area TA than edges of the light-shielding insulating layer 123 that define the third opening 123OP3 are to the transmission area TA, and edges of the inorganic insulating layers that define the eighth opening IL-OP may be arranged closer to the transmission area TA than edges of the blocking metal layer BML that define the third opening 123OP3 are to the transmission area TA.

Figure 12A:
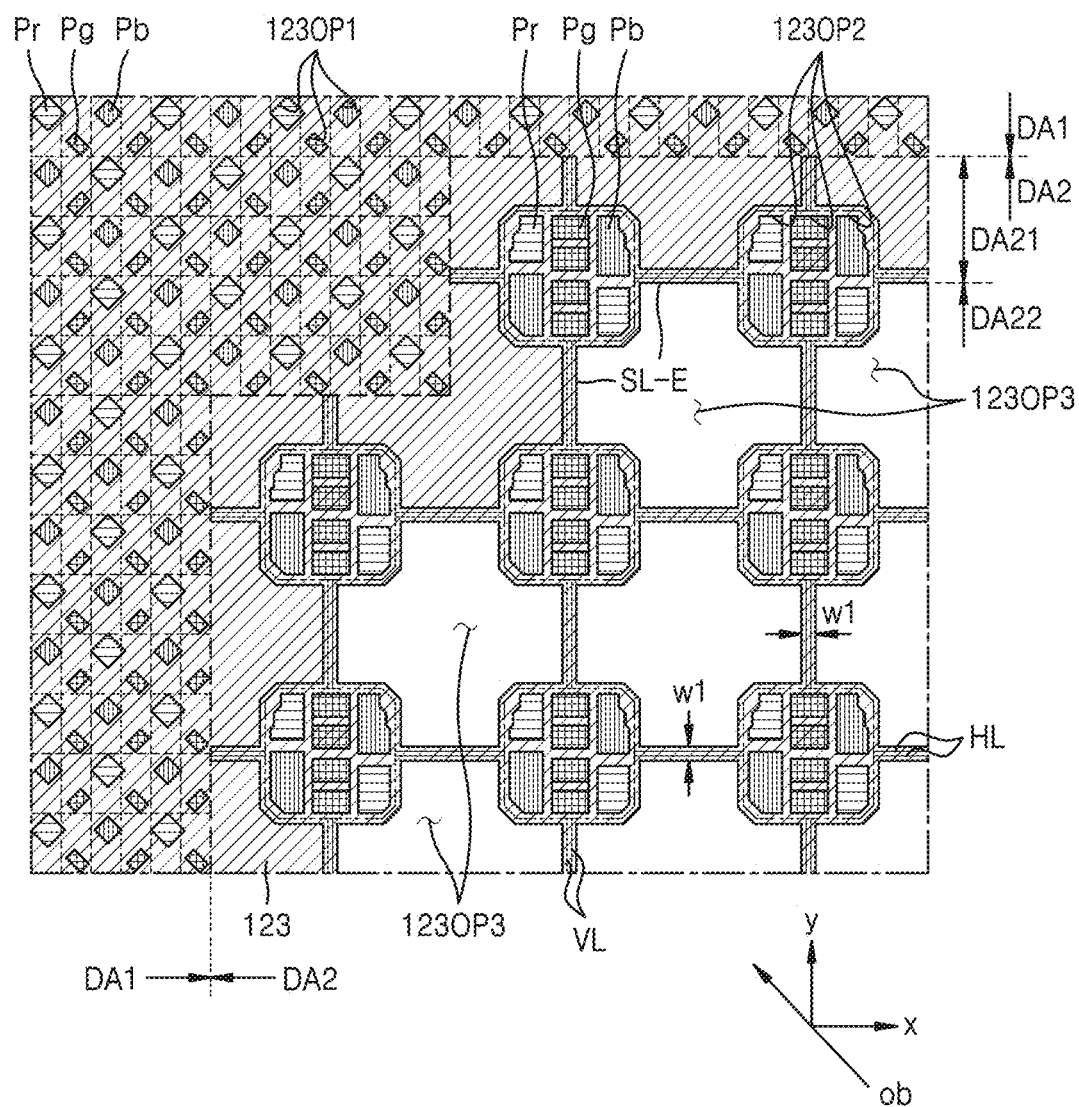
FIG. 12A is a plan view illustrating an embodiment of a light-shielding insulating layer of a display panel.
Figure 12B:
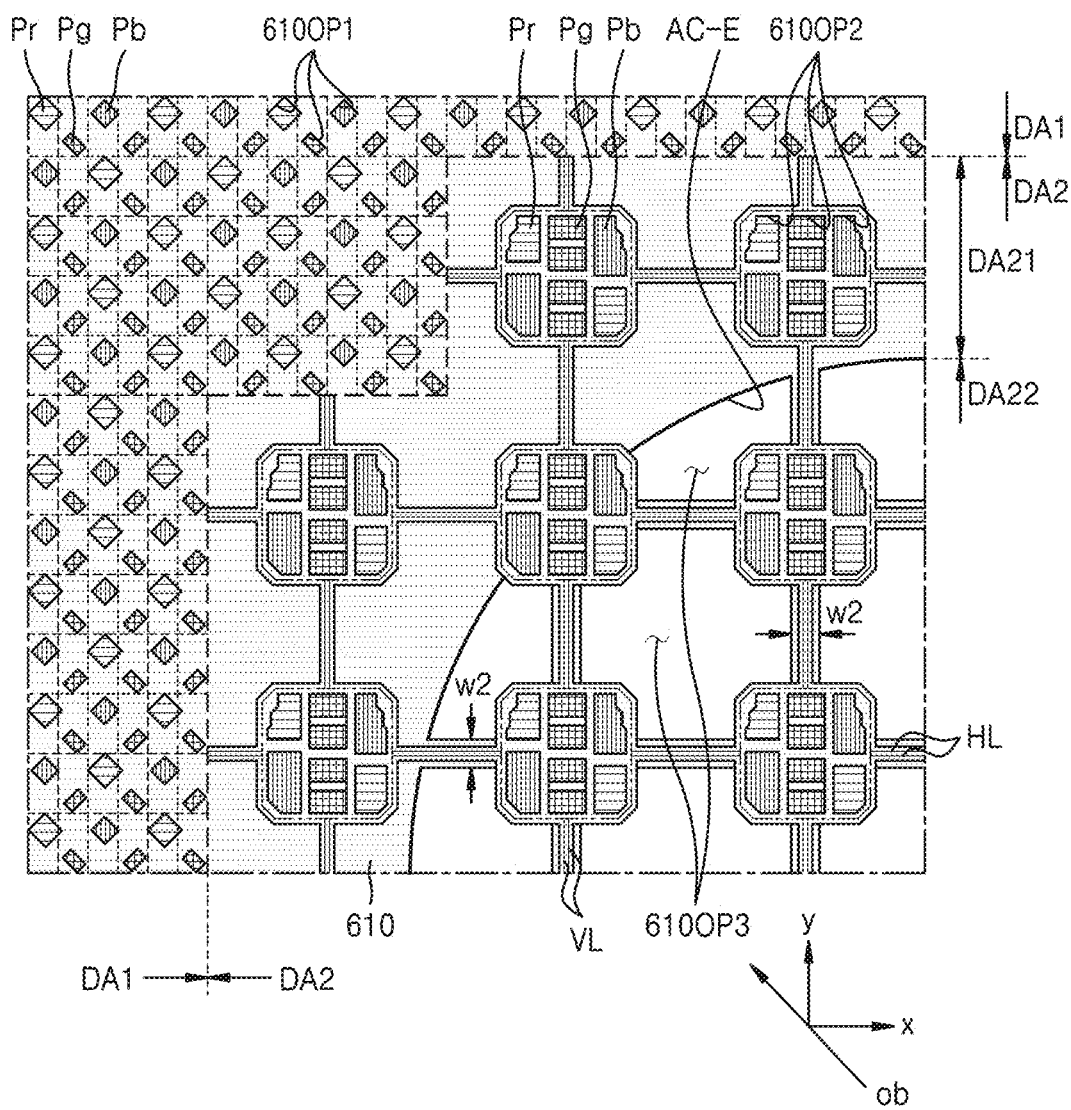
FIG. 12B is a plan view illustrating an embodiment of a light-shielding layer of a display panel.
Figure 12C:
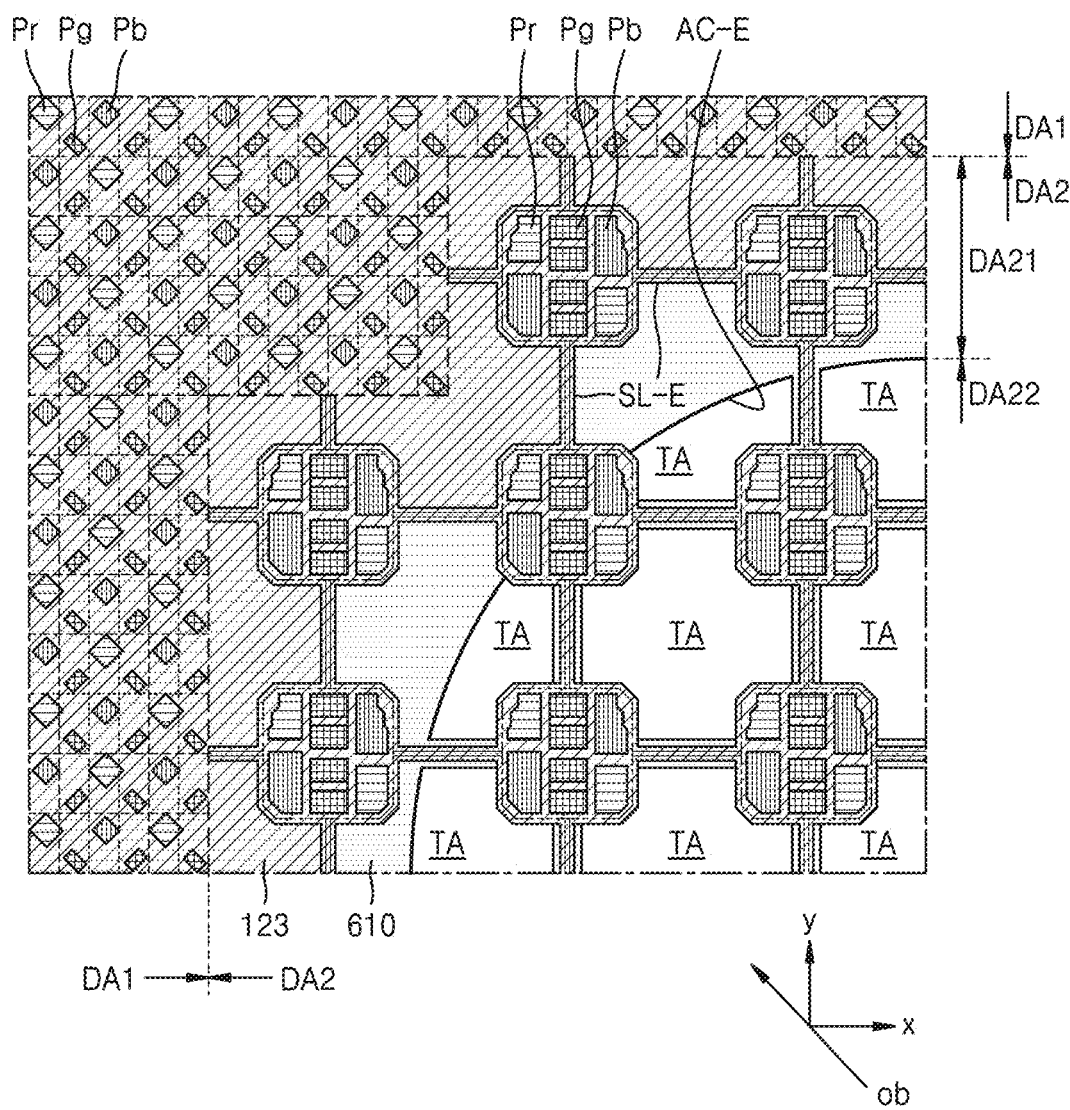
FIG. 12C is a plan view illustrating an embodiment of in which the light-shielding insulating layer in FIG. 12A and the light-shielding layer in FIG. 12B overlap each other.

FIG. 12A is a plan view illustrating an embodiment of a light-shielding insulating layer of a display panel, FIG. 12B is a plan view illustrating an embodiment of a light-shielding layer of a display panel, and FIG. 12C is a plan view in which the light-shielding insulating layer of FIG. 12A and the light-shielding layer of FIG. 12B overlap each other.

Referring to FIGS. 12A and 12C, first and second openings 123OP1 and 123OP2 each corresponding to pixels, e.g., red, green, and blue pixels Pr, Pg, and Pb may be defined in a light-shielding insulating layer 123. An arrangement of the first openings 123OP1 may be substantially same as the arrangement of pixels described with reference to FIG. 6. An arrangement of the second openings 123OP2 may be substantially same as the arrangement of pixels described with reference to FIGS. 7A and 7B.

A third opening 123OP3 in a second display area DA2 may be defined in the light-shielding insulating layer 123. The third opening 123OP3 is arranged in a second inner display area DA22 of the second display area DA2, but may not be in a second outer display area DA21. In an embodiment, an opening may not be arranged between pixels of a first display area DA1 and pixels of the second display area DA2 closest to the first display area DA1, for example. The third openings 123OP3 may be arranged in an x direction, a y direction, and an ob direction in the second inner display area DA22.

The third openings 123OP3 may be spaced apart from each other. The light-shielding insulating layer 123 may include a portion between the third openings 123OP3 adjacent to each other in the x and y directions, and the corresponding portion may cover a first line (or a transverse line) HL extending in the x direction and a second line (or a vertical line) VL extending in the y direction. The first line HL may include a scan line described with reference to FIG. 5, and the second line VL may include a data line and/or a driving voltage line.

Referring to FIGS. 12B and 12C, fourth openings 610OP1 and fifth openings 610OP2 each corresponding to pixels, e.g., red, green, and blue pixels Pr, Pg, and Pb, may be defined in a light-shielding layer 610. An arrangement of the fourth openings 610OP1 may be substantially same as an arrangement of the first openings 123OP1. The arrangement of the fourth openings 61OP1 may be substantially same as the arrangement of pixels described with reference to FIG. 6. An arrangement of the fifth openings 610OP2 may be substantially same as an arrangement of the second openings 123OP2. In an embodiment, the arrangement of the fifth openings 610OP2 may be substantially same as the arrangement of pixels described with reference to FIGS. 7A and 7B, for example.

A sixth opening 610OP3 in a second display area DA2 may be defined in the light-shielding layer 610. The sixth opening 610OP3 is arranged in the second inner display area DA22 of the second display area DA2, but may not be in the second outer display area DA21. The sixth openings 610OP3 may be arranged in the x direction, the y direction, and the ob direction in the second inner display area DA22.

The sixth openings 610OP3 may be spaced apart from each other. The light-shielding layer 610 may include a portion between the sixth openings 610OP3 that are adjacent to each other in the x and y directions, and the corresponding portion may cover the first line (or the transverse line) HL extending in the x direction and the second line (or the vertical line) VL extending in the y direction. A portion of the light-shielding layer 610 covering the first line HL and the second line VL overlaps the portion of the light-shielding insulating layer 123, but the widths of the portion of the light-shielding insulating layer 123 and the portion of the light-shielding layer 610 may be same as or different from each other. In this regard, FIGS. 12A to 12C illustrate that a first width w1 of the part of the light-shielding insulating layer 123 is less than a second width w2 of the part of the light-shielding layer 610, but the first width w1 may be equal to or greater than the second width w2.

Sixth openings 610OP3 arranged at an outer periphery from among the sixth openings 610OP3 may have a planar shape different from a planar shape of sixth openings 610OP3 arranged on the inside. An edge on one side of the sixth opening 610OP3 arranged at the outer periphery may be a curved edge AC-E in a plan view, and thus, the sixth opening 610OP3 arranged at the outer periphery may have a planar shape different from a planar shape of the sixth opening 610OP3 arranged on the inside.

An edge adjacent to the first display area DA1 from among the edges of the light-shielding layer 610 that define the sixth opening 610OP3 arranged at the outer periphery is the curved edge AC-E, whereas an edge adjacent to the first display area DA1 from among the edges of the light-shielding insulating layer 123 that define the third opening 123OP3 arranged on the outer periphery may be a straight edge SL-E. The straight edges SL-E may extend in different directions to have a step configuration in a plan view.

The straight edge SL-E of the light-shielding insulating layer 123 may be closer to the first display area DA1 than the curved edge AC-E of the light-shielding layer 610 is to the first display area DA1. Accordingly, a part of the third opening 123OP3 arranged at the outer periphery may overlap the light-shielding layer 610. In other words, as shown in FIG. 12C, an area between the straight edge SL-E of the light-shielding insulating layer 123 and the curved edge AC-E of the light-shielding layer 610 does not overlap the light-shielding insulating layer 123, but may overlap the light-shielding layer 610.

Figure 13A:
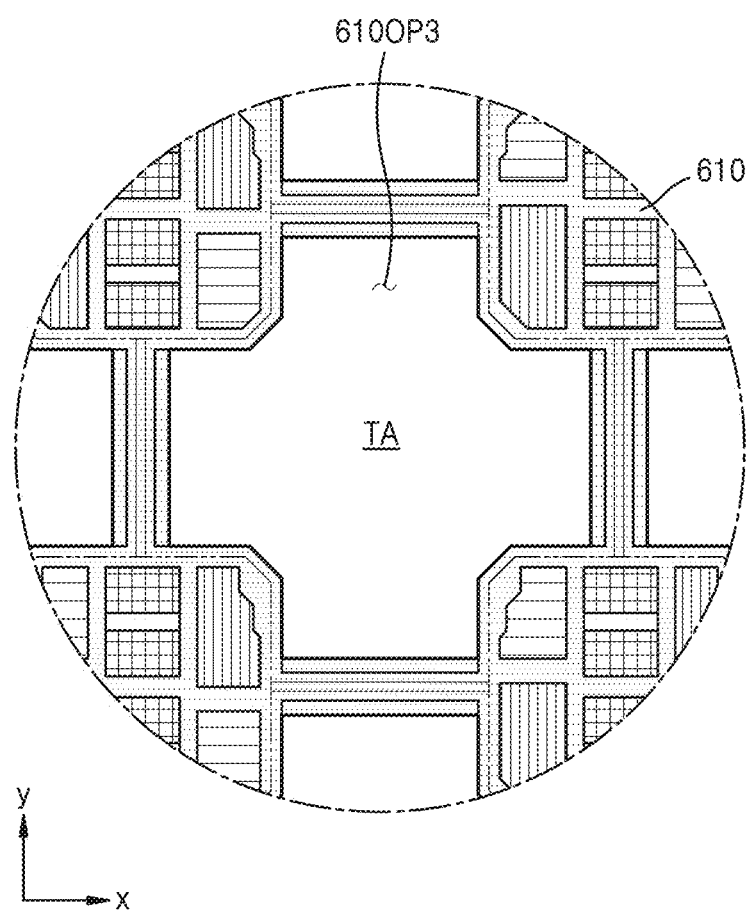
FIGS. 13A and 13B are plan views illustrating an embodiment of a transmission area.
Figure 13B:
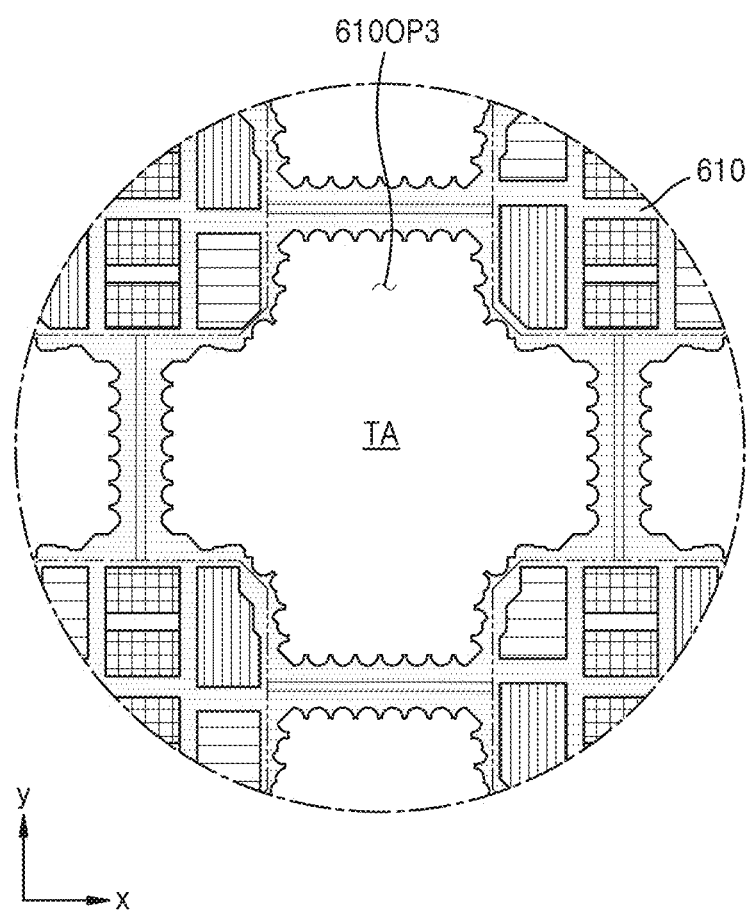

FIGS. 13A and 13B are plan views illustrating an embodiment of a transmission area TA.

Referring to FIGS. 13A and 13B, the transmission area TA may have an approximately cross shape in a plan view. A third opening 123OP3 and a sixth opening 610OP3 corresponding to the transmission area TA may be respectively defined in a light-shielding insulating layer 123 and a light-shielding layer 610 described above with reference to FIGS. 12A to 12C, and at least one of the third opening 123OP3 and the sixth opening 610OP3 may include straight edges or edges having fine irregularities.

In an embodiment, FIG. 13A illustrates that the sixth opening 610OP3 includes straight edges, and FIG. 13B illustrates that the sixth opening 610OP3 includes edges having fine irregularities. In other words, the edges of the light-shielding layer 610 defining the sixth opening 610OP3 may be straight as shown in FIG. 13A or may have a repeated, uneven structure as shown in FIG. 13B, and in a plan view, the transmission area TA may include a straight edge or may include an edge having a repetitive uneven structure. When the transmission area TA includes an edge of a repeated, uneven structure, diffraction of light passing the transmission area TA may be prevented or minimized.

FIGS. 13A and 13B illustrate that the edge of the light-shielding layer 610 is straight or has fine irregularities, but the invention is not limited thereto. In another embodiment, the edges of the light-shielding insulating layer 123 defining the third opening 123OP3 may include straight edge(s) or edge(s) having fine irregularities.

Figure 14A:
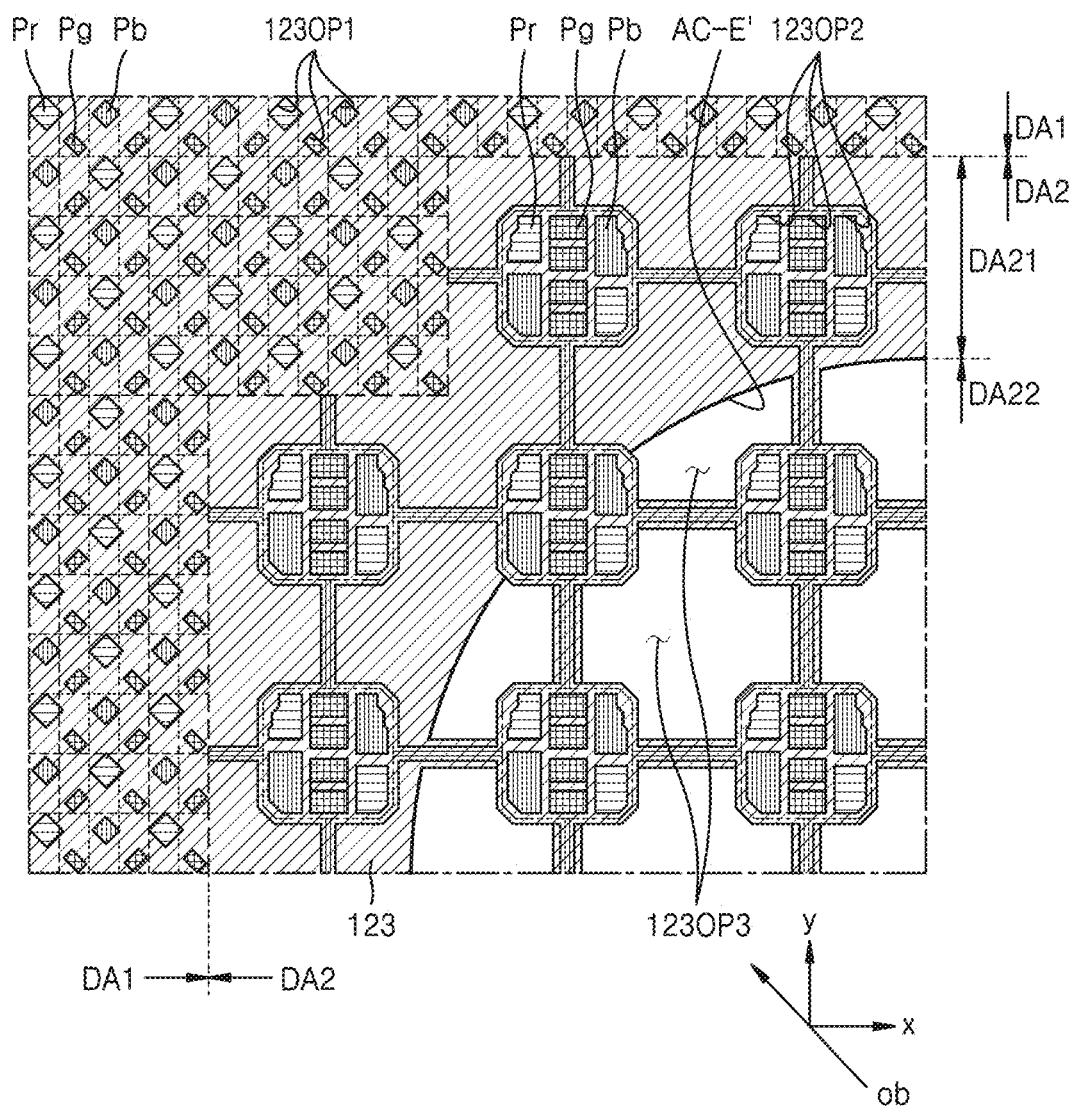
FIG. 14A is a plan view illustrating an embodiment of a light-shielding insulating layer of a display panel.
Figure 14B:
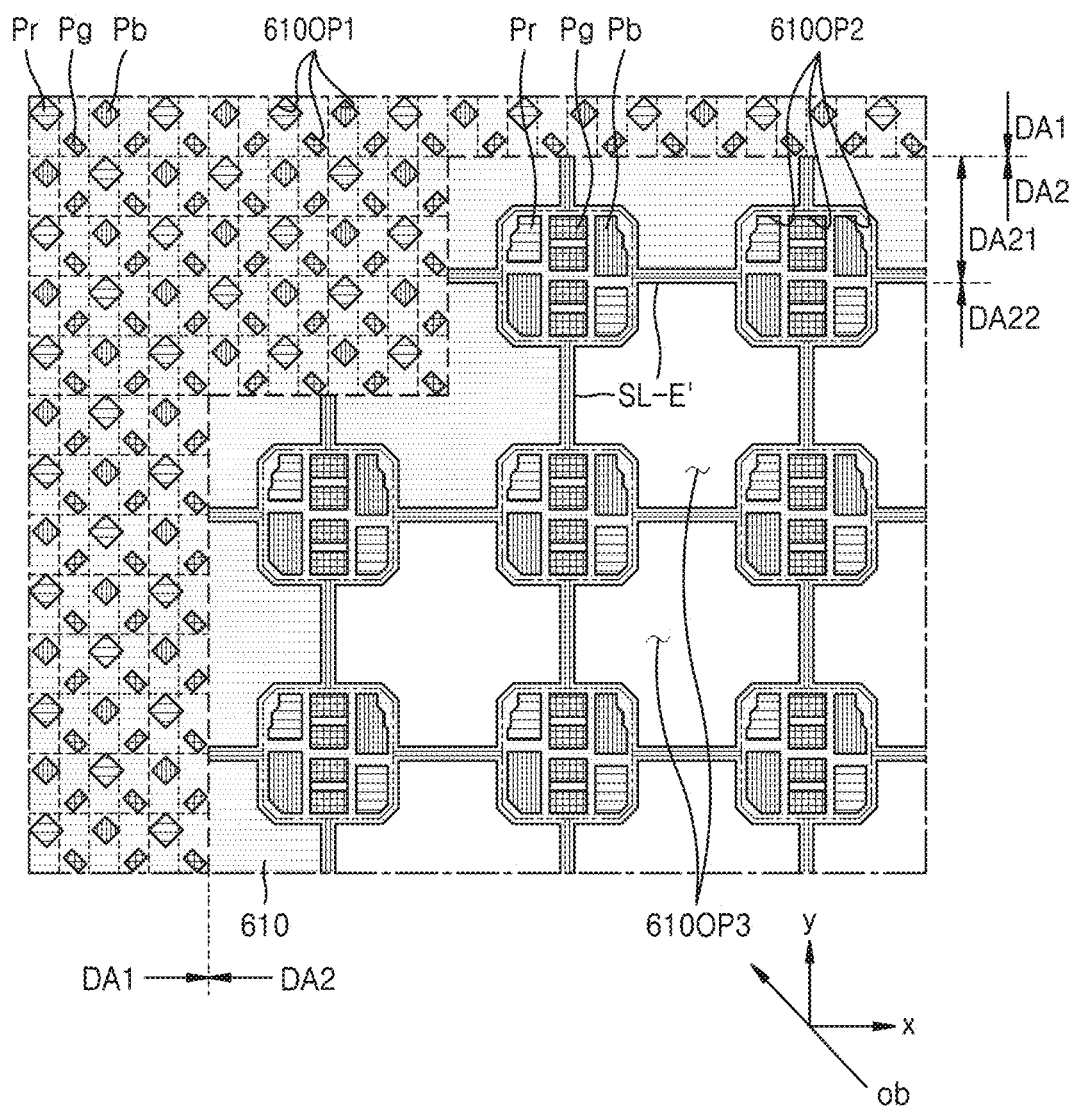
FIG. 14B is a plan view illustrating an embodiment of a light-shielding layer of a display panel.
Figure 14C:
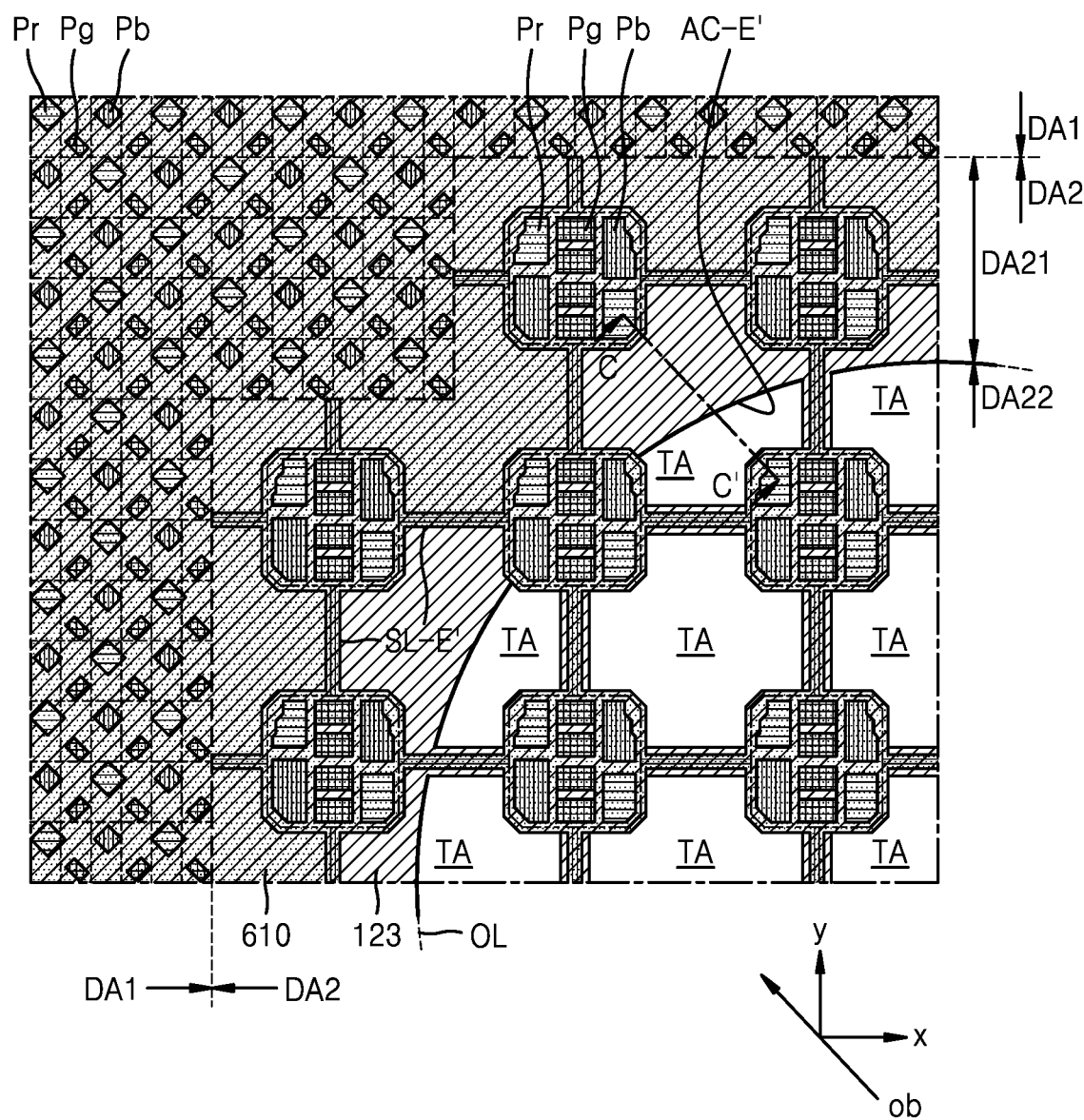
FIG. 14C is a plan view illustrating an embodiment of in which the light-shielding insulating layer in FIG. 14A and the light-shielding layer in FIG. 14B overlap each other.

FIG. 14A is a plan view illustrating an embodiment of a light-shielding insulating layer of a display panel, FIG. 14B is a plan view illustrating an embodiment of a light-shielding layer of a display panel, and FIG. 14C is a plan view in which the light-shielding insulating layer of FIG. 14A and the light-shielding layer of FIG. 14B overlap each other.

Referring to FIGS. 14A to 14C, first to third openings 123OP1, 123OP2 and 123OP3 may be defined in a light-shielding insulating layer 123, and fourth to sixth openings 610OP1, 610OP2, and 610OP3 may be defined in a light-shielding layer 610, as described above with reference to FIGS. 12A to 12C. FIGS. 12A to 12C illustrate that the light-shielding layer 610 includes the curved edge AC-E, and that the light-shielding insulating layer 123 includes a straight edge SL-E closer to the first display area DA1 than the curved edge AC-E of the light-shielding layer 610 is to the first display area DA1. In contrast, FIGS. 14A to 14C illustrate that the light-shielding insulating layer 123 includes a curved edge AC-E, and that the light-shielding layer 610 includes a straight edge SL-E' closer to the first display area DA1 than the curved edge AC-E' of the light-shielding insulating layer 123 is to the first display area DA1. In this case, an outermost line OL (refer to FIG. 14C) of the transmission area TA may be defined by the curved edge AC-E' of the light-shielding insulating layer 123.

FIG. 15 is a cross-sectional view of an embodiment of the display panel in FIG. 14C, taken along line C-C'. FIG. 15 illustrates a transmission area arranged at an outer periphery from among a plurality of transmission areas, and a cross-sectional structure therearound, and other structures except for the structures of the light-shielding insulating layer 123 and the light-shielding layer 610 shown in FIG. 15 are same as the structure described with reference to FIG. 11, and thus, differences will be mainly described below.

Referring to FIGS. 14C and 15, a size (or width) of an outermost transmission area TA from among the transmission areas TA may be defined by the light-shielding insulating layer 123. A third opening 123OP3 corresponding to the transmission area TA may be defined in the light-shielding insulating layer 123, and a sixth opening 610OP3 corresponding to the transmission area TA may be defined in the light-shielding layer 610. The sixth opening 610OP3 overlaps the third opening 123OP3, but a size (or width) of the sixth opening 610OP3 may be greater than a size (or width) of the third opening 123OP3. In other words, the sixth opening 610OP3 may overlap the light-shielding insulating layer 123 adjacent to a curved edge AC-E' and a part of the light-shielding insulating layer 123 close to the curved edge AC-E.

Edges of the light-shielding insulating layer 123 arranged at both sides of the third opening 123OP3 shown in FIG. 15 are respectively spaced apart from edges of the light-shielding layer 610 arranged at both sides of the sixth opening 610OP3, but the spacing distances may be different from each other. In an embodiment, an edge of the light-shielding insulating layer 123 arranged on a left side of the third opening 123OP3 shown in FIG. 15, e.g., the curved edge AC-E, may be spaced apart by a first distance d1' from an edge of the light-shielding layer 610 arranged on a left side of the sixth opening 610OP3, and an edge of the light-shielding insulating layer 123 arranged on a right side of the third opening 123OP3 may be spaced apart by a second distance d2' from an edge of the light-shielding layer 610 arranged on a right side of the sixth opening 610OP3, for example. In this case, the first distance d1' may be greater than the second distance d2'.

An opening overlapping the transmission area TA may be defined in each of the second electrode 230, the blocking metal layer BML, and a stack of inorganic insulating layers. A size (or width) of a seventh opening 230OP of the second electrode 230 may be greater than the size (or width) of the third opening 123OP3.

A size (or width) of a ninth opening BML-OP of the blocking metal layer BML may be greater than a size (or width) of an eighth opening IL-OP of the stack of insulating layers. The size (or width) of the ninth opening BML-OP may be greater than the size (or width) of the third opening 123OP3.

An edge of the light-shielding insulating layer 123 defining the third opening 123OP3 may be closer to the transmission area TA than an edge of the blocking metal layer BML defining the ninth opening BML-OP is to the transmission area TA. The edge of the light-shielding insulating layer 123 defining the third opening 123OP3 may be closer to the transmission area TA than edges of the inorganic insulating layers defining the eighth opening IL-OP are to the transmission area TA.

Figure 16A:
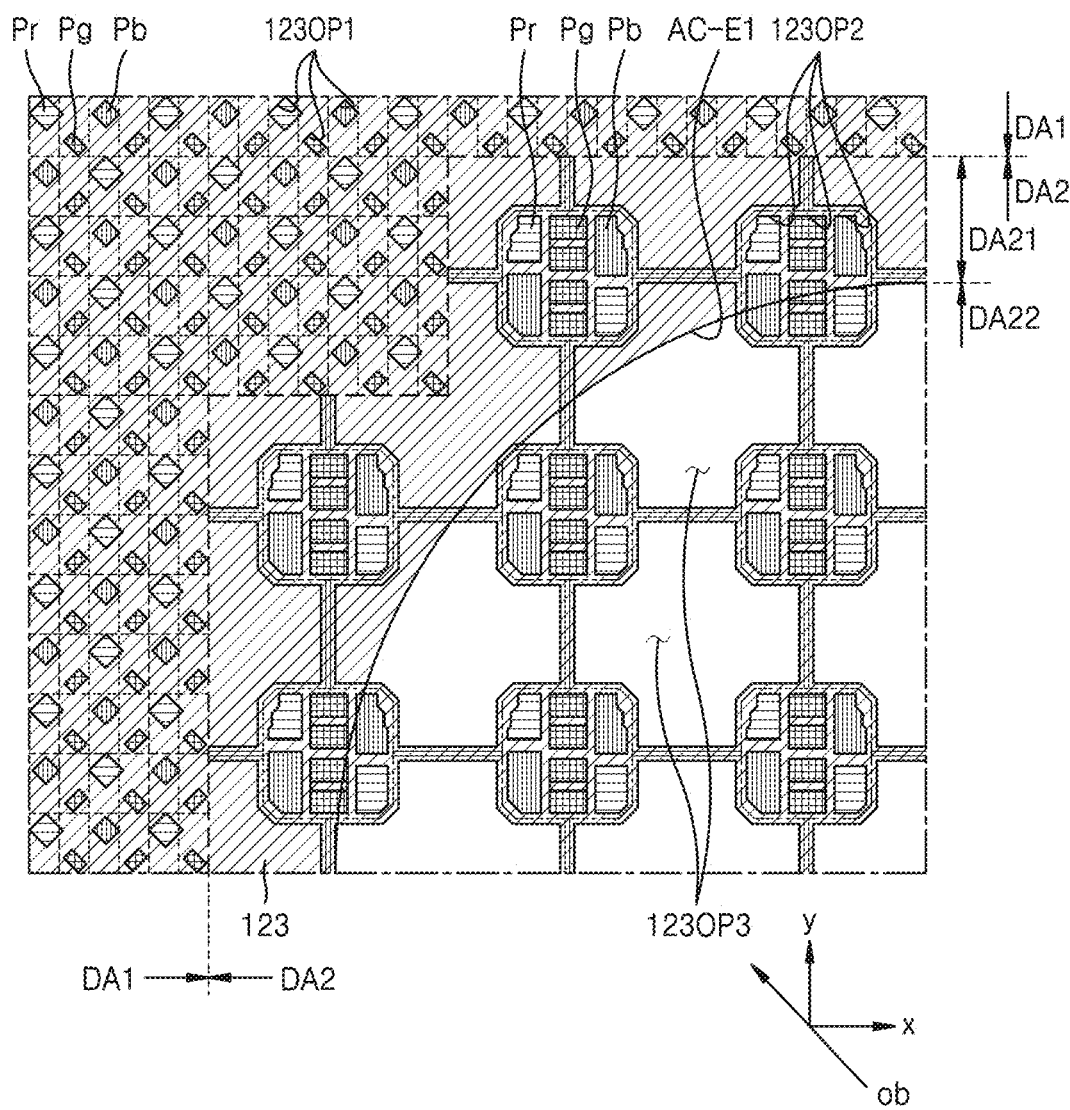
FIG. 16A is a plan view illustrating an embodiment of a light-shielding insulating layer of a display panel.
Figure 16B:
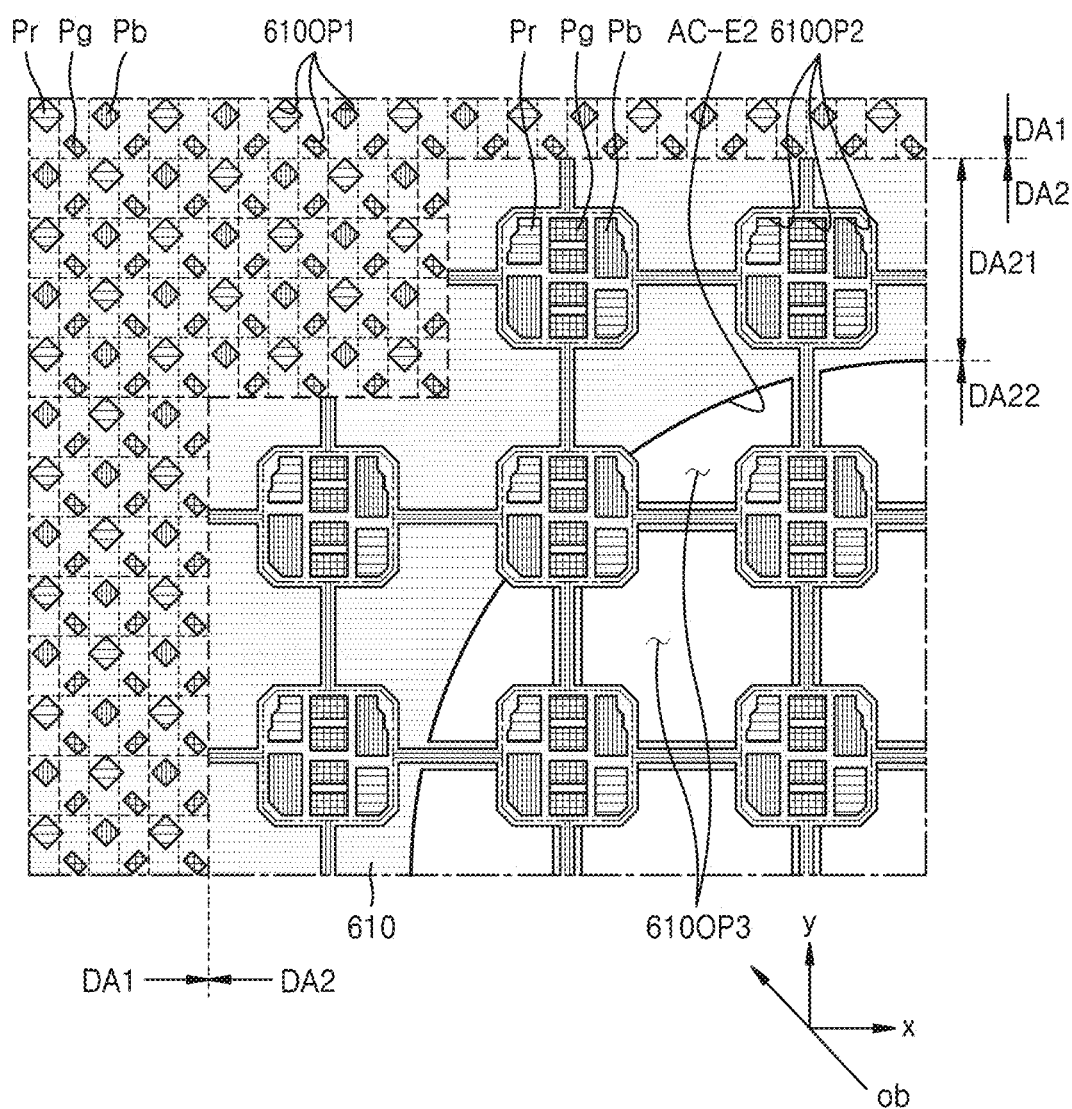
FIG. 16B is a plan view illustrating an embodiment of a light-shielding layer of a display panel.
Figure 16C:
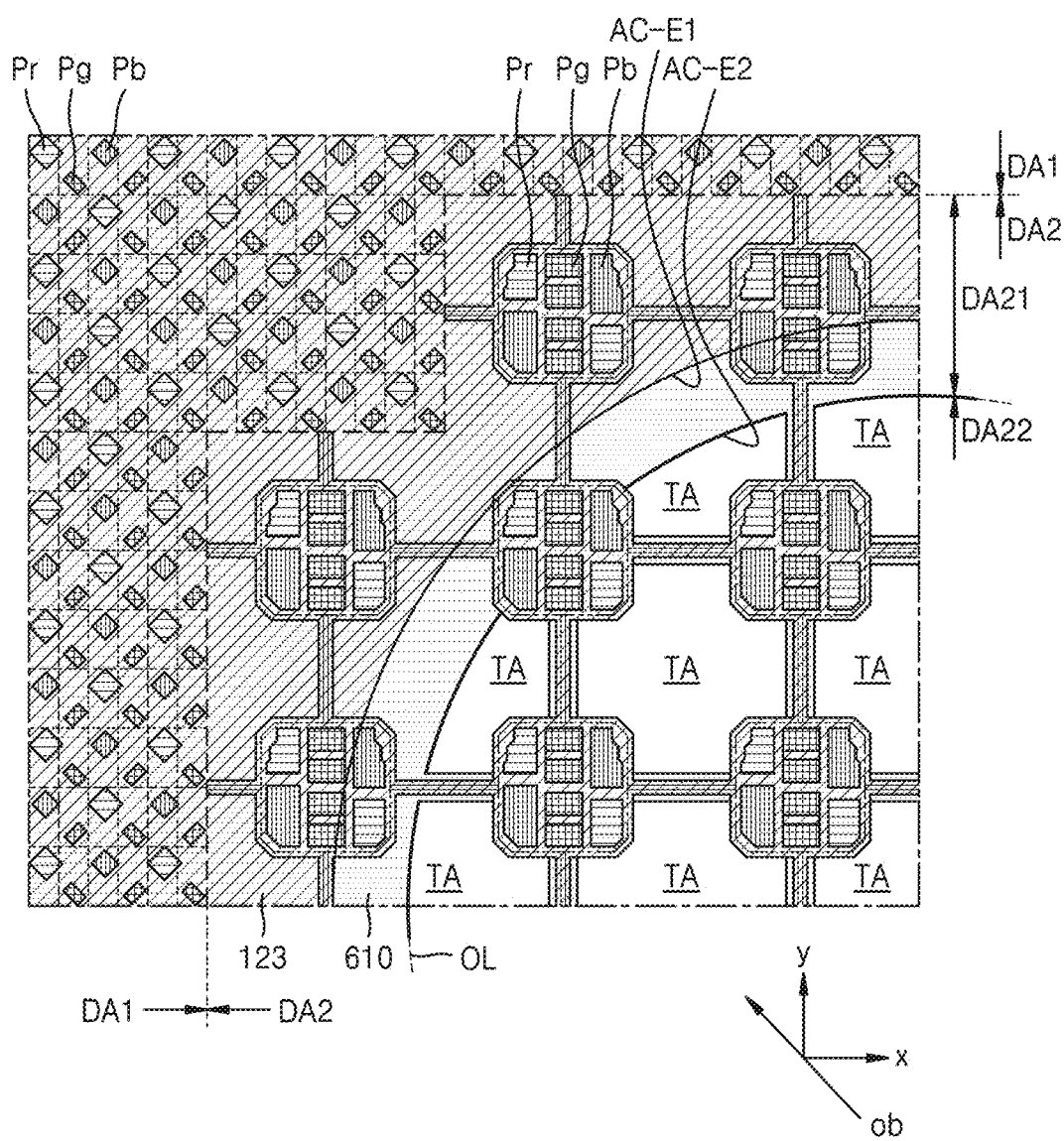
FIG. 16C is a plan view illustrating an embodiment of in which the light-shielding insulating layer in FIG. 16A and the light-shielding layer in FIG. 16B overlap each other.

FIG. 16A is a plan view illustrating an embodiment of a light-shielding insulating layer 123 of a display panel, FIG. 16B is a plan view illustrating an embodiment of a light-shielding layer 610 of a display panel, and FIG. 16C is a plan view in which the light-shielding insulating layer 123 of FIG. 16A and the light-shielding layer 610 of FIG. 16B overlap each other.

Referring to FIGS. 16A to 16C, first to third openings 123OP1, 123OP2 and 123OP3 are defined in the light-shielding insulating layer 123, and fourth to sixth openings 610OP1, 610OP2, and 610OP3 may be defined in the light-shielding layer 610, as described above with reference to FIGS. 14A to 14C. It is described with reference to FIGS. 12A to 12C and FIGS. 14A to 14C that one from among the light-shielding layer 610 and the light-shielding insulating layer 123 includes a curved edge AC-E or AC-E', and that the other one includes a straight edge SL-E or SL-E' closer to the first display area DA1 than the curved edge AC-E is to the first display area DA1. In contrast, FIGS. 16A to 16C illustrate that the light-shielding insulating layer 123 and the light-shielding layer 610 may include the curved edges AC-E1 and AC-E2, respectively.

Referring to FIG. 16C, the curved edge AC-E1 of the light-shielding insulating layer 123 may be closer to the first display area DA1 than the curved edge AC-E2 of the light-shielding layer 610 is to the first display area DA1, and in this case, an outermost line OL of a transmission area TA may be defined by the curved edge AC-E2 of the light-shielding layer 610.

In another embodiment, the curved edge AC-E2 of the light-shielding layer 610 may be closer to the first display area DA1 than the curved edge AC-E1 of the light-shielding insulating layer 123 is to the first display area DA1, and in this case, the outermost line OL of the transmission area TA may be defined by the curved edge AC-E1 of the light-shielding insulating layer 123.

Figure 17:
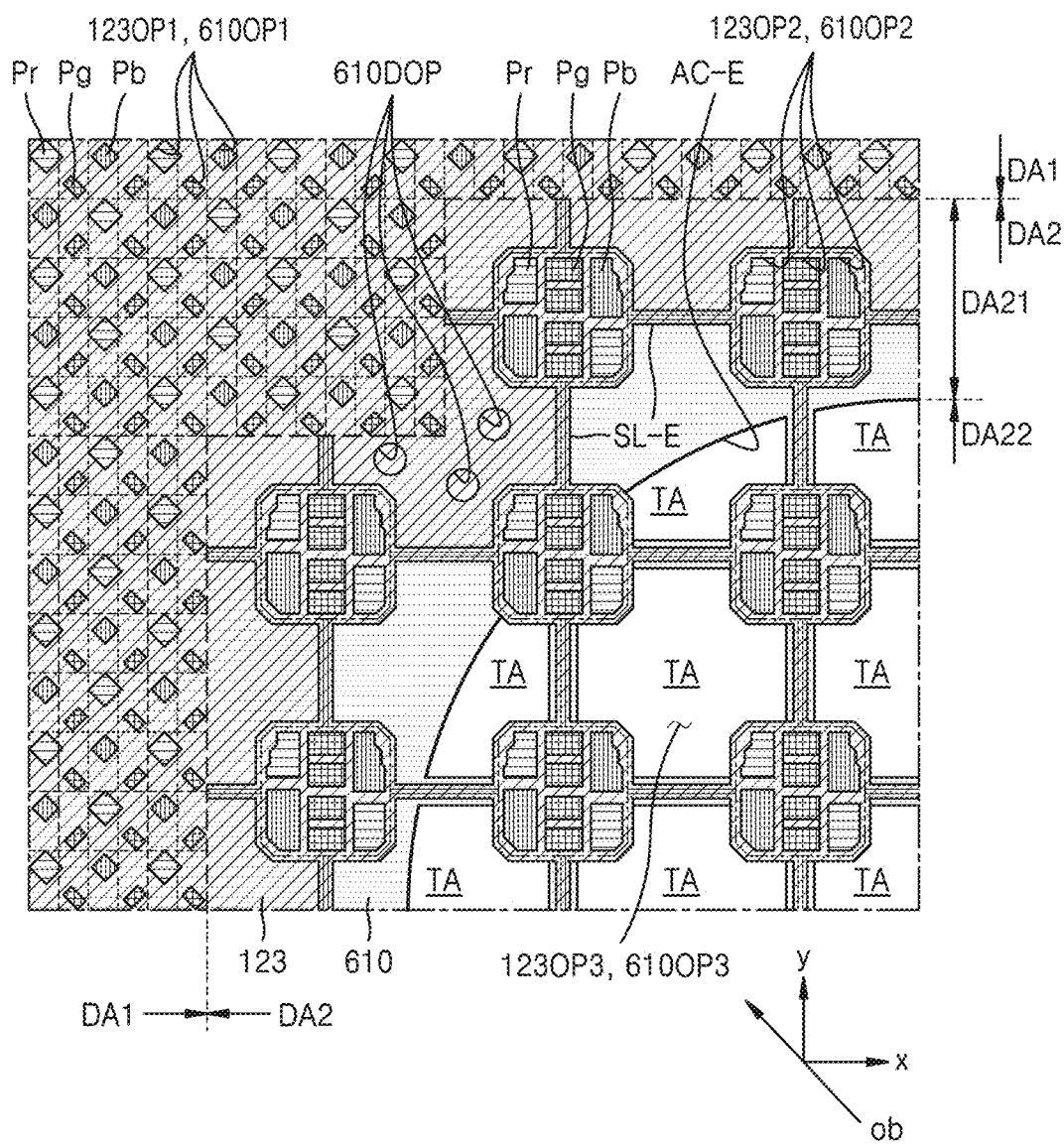
FIG. 17 is a plan view of an embodiment of a part of a display panel.

FIG. 17 is a plan view of an embodiment of a part of a display panel. A structure shown in FIG. 17 is same as the structure described with reference to FIGS. 9, 10, 11, 12A, 12B, and 12C, and differences will be mainly described below.

The display panel in an embodiment may prevent reflection of external light by a light-shielding layer 610 and a light-shielding insulating layer 123. Also, reflection of external light in the first display area DA1, which has a relatively large overlapping area between the light-shielding layer 610 and the light-shielding insulating layer 123 in a plan view of the display panel, appears to be less than external reflection in a second inner display area DA22 including the transmission area TA. As the difference between the external light reflectance in the first display area DA1 and the external light reflectance in the second inner display area DA22 becomes greater, the border line between the first display area DA1 and the second display area DA2 becomes more visible to the user. To prevent this, a dummy opening in a second outer display area DA21 may be defined in one from among the light-shielding layer 610 and the light-shielding insulating layer 123. The dummy opening is neither for image expression, such as the first and second openings 123OP1 and 123OP2 and the fourth and fifth openings 610OP1 and 610OP2, nor for transmission of light used by a component, such as the third and sixth openings 123OP3 and 610OP3. The dummy opening is for adjusting a difference in reflectance of external light for each area, and FIG. 17 illustrates that a dummy opening 610DOP is defined in the light-shielding layer 610. The dummy opening 610DOP of the light-shielding layer 610 may overlap a part of the light-shielding insulating layer 123.

In another embodiment, a dummy opening in the second outer display area DA21 may be defined in the light-shielding insulating layer 123. The dummy opening described with reference to FIG. 17 may be equally applied to the display panels described with reference to FIGS. 14A to 14C and 16A to 16C.

It should be understood that the embodiments described herein should be considered in a descriptive sense only and not for purposes of limitation. Descriptions of features or advantages within each of the embodiments should typically be considered as available for other similar features or advantages in other embodiments. While one or more embodiments have been described with reference to the drawing figures, it will be understood by one of ordinary skill in the art that various changes in form and details may be made therein without departing from the spirit and scope of the invention.

What is claimed is:

1. A display panel comprising:
   a first display area in which first light-emitting diodes are arranged;
   a second display area at least partially surrounded by the first display area and including a transmission area, the transmission area including sub-transmission areas, wherein, in a plan view, display element groups and the sub-transmission areas are two-dimensionally arranged in the second display area, and the display element groups respectively include second light-emitting diodes;
   a light-shielding insulating layer defining a light-emitting area of each of the first light-emitting diodes and the second light-emitting diodes; and
   an anti-reflection layer on the light-shielding insulating layer and comprising a light-shielding layer and color filters,
   wherein, in the plan view;
   an outermost line of the transmission area is defined by a curved edge of the light-shielding layer,
   the sub-transmission areas comprise a first sub-transmission area that is closer to a center of the second display area than a second sub-transmission area is to the center of the second display area, and the second sub-transmission area is close to the outermost line of the transmission area, and
   the light-shielding layer has openings that are separated from each other and respectively define the sub-transmission areas, one of the openings of the light-shielding layer corresponding to the first sub-transmission area has a shape that is different from a shape of another of the openings of the light-shielding layer corresponding to the second sub-transmission area.

2. The display panel of claim 1, wherein a width of the another of the openings of the light-shielding layer measured in a first direction crossing the curved edge is less than a width of the one of the openings of the light-shielding layer measured in the first direction.

3. The display panel of claim 1, wherein first openings respectively corresponding to the first light-emitting diodes, second openings respectively corresponding to the second light-emitting diodes, and third openings being between the display element groups and corresponding to the sub-transmission areas are defined in the light-shielding insulating layer, and
   fourth openings respectively overlapping the first openings and fifth openings respectively overlapping the second openings are defined in the light-shielding layer,
   wherein:
   a size of the one of the openings of the light-shielding layer is greater than a size of the another of the openings of the light-shielding layer.

4. The display panel of claim 3, wherein the color filters are disposed at the fourth openings and the fifth openings, and
   the anti-reflection layer further comprises an overcoat layer including a portion disposed at each of the openings of the light-shielding layer.

5. The display panel of claim 3, wherein each of the first light-emitting diodes and the second light-emitting diodes includes an overlapping structure, wherein the overlapping structure comprising:
   a first electrode; and
   an emission layer on the first electrode,
   wherein the first light-emitting diodes and the second light-emitting diodes commonly include a second electrode provided as a single body, wherein openings overlapping the third openings of the light-shielding insulating layer, the one of the openings of the light-shielding layer, and the another of the openings of the light-shielding layer are defined in the second electrode.

6. The display panel of claim 3, further comprising thin-film transistors electrically connected to each of the first light-emitting diodes and the second light-emitting diodes,
   wherein each of the thin-film transistors comprises:
   a semiconductor layer;
   a gate electrode overlapping a portion of the semiconductor layer;
   one electrode from among a source electrode and a drain electrode; and
   an insulating layer disposed between at least two selected from among the semiconductor layer, the gate electrode, and the one electrode.

7. The display panel of claim 6, wherein openings overlapping the third openings of the light-shielding insulating layer are defined in the insulating layer.

8. The display panel of claim 7, further comprising an organic insulating layer on the insulating layer, wherein a portion of the organic insulating layer is disposed in each of the openings of the insulating layer.

9. The display panel of claim 3, wherein:
in the plan view, a portion of the light-shielding layer disposed at one side of the curved edge covers a portion of the third opening.

10. The display panel of claim 9, wherein the light-shielding insulating layer comprises a straight edge in the plan view, and the straight edge of the light-shielding insulating layer is disposed closer to the first display area than the curved edge of the light-shielding layer is to the first display area.

11. The display panel of claim 3, wherein a dummy opening between the first display area and the transmission area is defined in one from among the light-shielding layer and the light-shielding insulating layer.

12. An electronic apparatus comprising:
a display panel comprising a first display area in which first light-emitting diodes are arranged, and a second display area in which second light-emitting diodes and a transmission area are arranged, wherein the transmission area includes sub-transmission areas, the display panel further comprising:
a light-shielding insulating layer defining a light-emitting area of each of the first light-emitting diodes and the second light-emitting diodes; and
an anti-reflection layer on the light-shielding insulating layer and comprising a light-shielding layer and color filters; and
a component on a surface of the display panel and overlapping the second light-emitting diodes and the sub-transmission areas which are two-dimensionally arranged in the second display area,
wherein, in a plan view:
an outermost line of the transmission area is defined by a curved edge of the light-shielding layer,
the sub-transmission areas comprise a first sub-transmission area that is closer to a center of the second display area than a second sub-transmission area is to the center of the second display area, and the second sub-transmission area is close to the outermost line of the transmission area, and
the light-shielding layer has openings that are separated from each other and respectively define the sub-transmission areas, one of the openings of the light-shielding layer corresponding to the first sub-transmission area has a shape that is different from a shape of another of the openings of the light-shielding layer corresponding to the second sub-transmission area.

13. The electronic apparatus of claim 12, wherein, in the plan view, a width of the component is greater than a width of a shape which is defined by the outermost line of the transmission area, and the shape has a circle shape or an ellipse shape.

14. The electronic apparatus of claim 12, wherein the light-shielding insulating layer comprises a straight edge in the plan view, and the straight edge of the light-shielding insulating layer is disposed closer to the first display area than the curved edge of the light-shielding layer is to the first display area.

15. The electronic apparatus of claim 12, wherein a dummy opening between the first display area and the transmission area is defined in one from among the light-shielding layer and the light-shielding insulating layer.

16. The electronic apparatus of claim 12, wherein the component comprises a sensor or a camera.

17. The electronic apparatus of claim 12, wherein first openings respectively corresponding to the first light-emitting diodes, second openings respectively corresponding to the second light-emitting diodes, and third openings corresponding to the sub-transmission areas are defined in the light-shielding insulating layer, and fourth openings respectively overlapping the first openings and fifth openings respectively overlapping the second openings are defined in the light-shielding layer.

18. The electronic apparatus of claim 17, wherein the color filters are disposed at the fourth openings and the fifth openings, and
the anti-reflection layer further comprises an overcoat layer including a portion is disposed at each of the openings of the light-shielding layer.

19. The electronic apparatus of claim 17, wherein each of the first light-emitting diodes and the second light-emitting diodes includes an overlapping structure, the overlapping structure comprising:
a first electrode; and
an emission layer on the first electrode, wherein the first light-emitting diodes and the second light-emitting diodes commonly include a second electrode provided as a single body, and wherein openings overlapping the third openings of the light-shielding insulating layer, the one of the openings of the light-shielding layer, and the another of the openings of the light-shielding layer are defined in the second electrode.

20. The electronic apparatus of claim 17, further comprising
thin-film transistors electrically connected to each of the first light-emitting diodes and the second light-emitting diodes,
wherein each of the thin-film transistors comprises:
a semiconductor layer;
a gate electrode overlapping a portion of the semiconductor layer;
one electrode from among a source electrode and a drain electrode; and
an insulating layer disposed between at least two selected from among the semiconductor layer, the gate electrode, and the one electrode.

21. The electronic apparatus of claim 20, wherein, in the plan view, openings overlapping the third openings of the light-shielding insulating layer are defined in the insulating layer, and an edge of the insulating layer defining one of the openings in the insulating layer is closer to one of the sub-transmission areas than an edge of the light-shielding insulating layer defining one of the third openings is to the transmission area.

22. The electronic apparatus of claim 21, further comprising an organic insulating layer on the insulating layer,
wherein a portion of the organic insulating layer is disposed in each of the openings of the insulating layer.

23. The electronic apparatus of claim 17, wherein a width of the another of the openings of the light-shielding layer measured in a first direction crossing the curved edge is less than a width of the one of the openings of the light-shielding layer measured in the first direction.

* * * * *